United States Patent
Ando et al.

(10) Patent No.: US 9,691,662 B2
(45) Date of Patent: Jun. 27, 2017

(54) FIELD EFFECT TRANSISTORS HAVING MULTIPLE EFFECTIVE WORK FUNCTIONS

(71) Applicant: GLOBALFOUNDRIES INC., Grand Cayman (KY)

(72) Inventors: Takashi Ando, Tuckahoe, NY (US); Min Dai, Allendale, NJ (US); Balaji Kannan, Fishkill, NY (US); Siddarth A. Krishnan, Newark, CA (US); Unoh Kwon, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/338,894

(22) Filed: Oct. 31, 2016

(65) Prior Publication Data

US 2017/0047255 A1 Feb. 16, 2017

Related U.S. Application Data

(62) Division of application No. 14/320,831, filed on Jul. 1, 2014, now Pat. No. 9,484,427.

(51) Int. Cl.
*H01L 21/8234* (2006.01)
*H01L 29/49* (2006.01)
(Continued)

(52) U.S. Cl.
CPC .... *H01L 21/823412* (2013.01); *H01L 21/324* (2013.01); *H01L 21/82345* (2013.01); *H01L 21/823431* (2013.01); *H01L 21/823462* (2013.01); *H01L 21/823842* (2013.01); *H01L 27/088* (2013.01); *H01L 27/092* (2013.01); *H01L 29/4966* (2013.01); *H01L 27/0886* (2013.01); *H01L 27/0924* (2013.01); *H01L 29/785* (2013.01)

(58) Field of Classification Search
CPC ............. H01L 29/66795; H01L 27/092; H01L 21/82345; H01L 29/41791; H01L 29/66537; H01L 21/845; H01L 29/517; H01L 21/28026; H01L 27/0886; H01L 29/511
See application file for complete search history.

(56) References Cited

U.S. PATENT DOCUMENTS 7,531,404 B2   5/2009   Pae et al.
7,691,701 B1   4/2010   Belyansky et al.
(Continued)

*Primary Examiner* — Bac Au
(74) *Attorney, Agent, or Firm* — Scully, Scott, Murphy & Presser, P.C.

(57) ABSTRACT

Selective deposition of a silicon-germanium surface layer on semiconductor surfaces can be employed to provide two types of channel regions for field effect transistors. Anneal of an adjustment oxide material on a stack of a silicon-based gate dielectric and a high dielectric constant (high-k) gate dielectric can be employed to form an interfacial adjustment oxide layer contacting a subset of channel regions. Oxygen deficiency can be induced in portions of the high-k dielectric layer overlying the interfacial adjustment oxide layer by deposition of a first work function metallic material layer and a capping layer and a subsequent anneal. Oxygen deficiency can be selectively removed by physically exposing portions of the high-k dielectric layer. A second work function metallic material layer and a gate conductor layer can be deposited and planarized to form gate electrodes that provide multiple effective work functions.

10 Claims, 16 Drawing Sheets

(51) Int. Cl.
   *H01L 21/8238*   (2006.01)
   *H01L 27/092*    (2006.01)
   *H01L 21/324*    (2006.01)
   *H01L 27/088*    (2006.01)
   *H01L 29/78*     (2006.01)

(56) References Cited

U.S. PATENT DOCUMENTS

| | | |
|---|---|---|
| 9,082,702 B2    | 7/2015  | Lei et al. |
| 2013/0295759 A1 | 11/2013 | Lu et al. |
| 2014/0002786 A1 | 1/2014  | Alderson |
| 2014/0106556 A1 | 4/2014  | Schram et al. |
| 2014/0151814 A1 | 6/2014  | Giles et al. |
| 2014/0252487 A1 | 9/2014  | Stephens et al. |
| 2015/0021698 A1 | 1/2015  | Ando et al. |

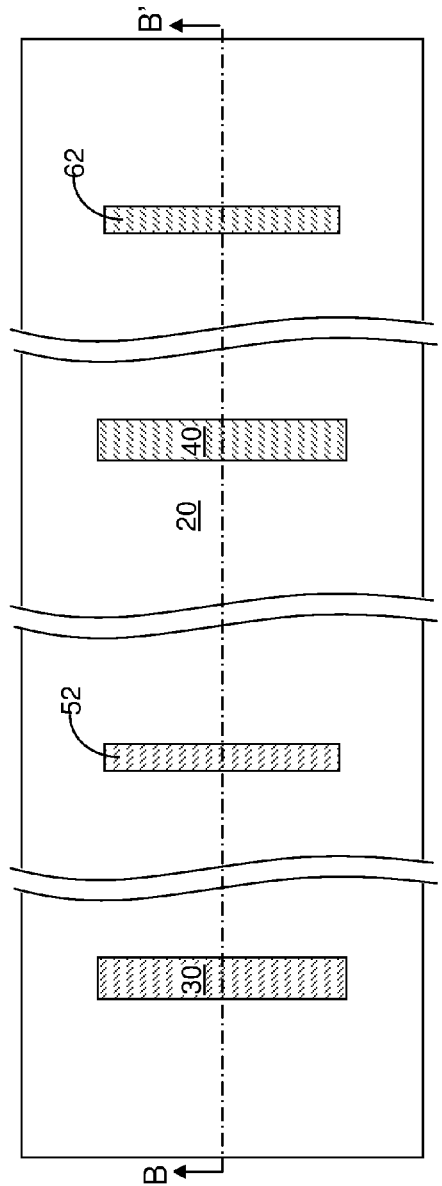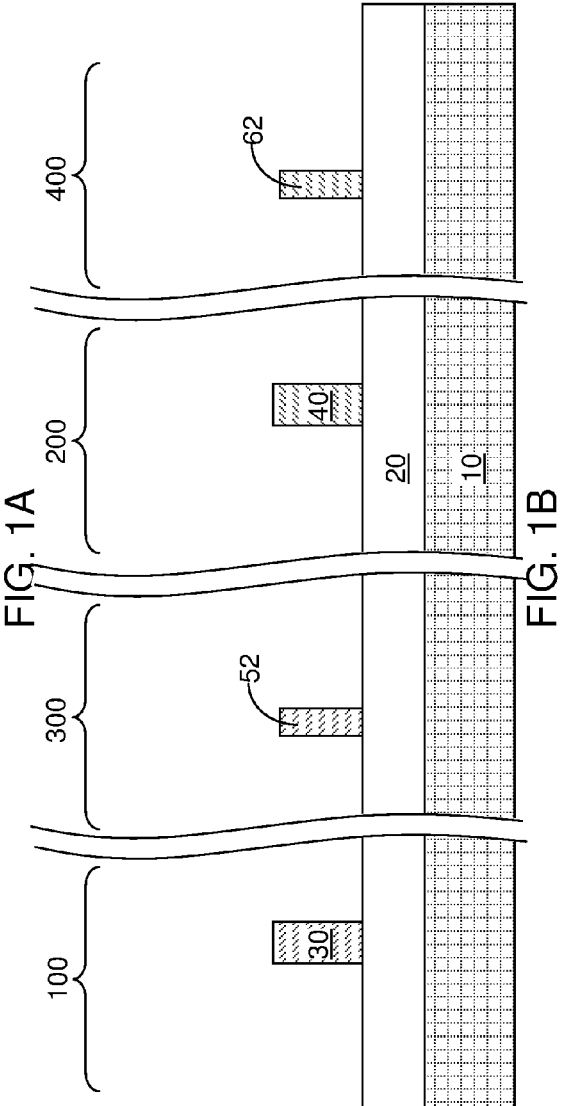

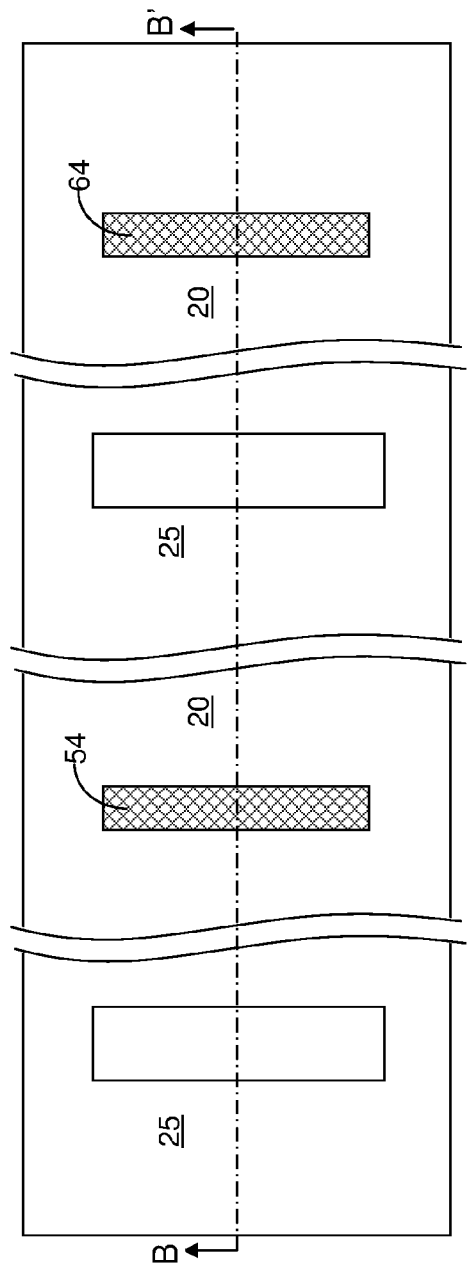
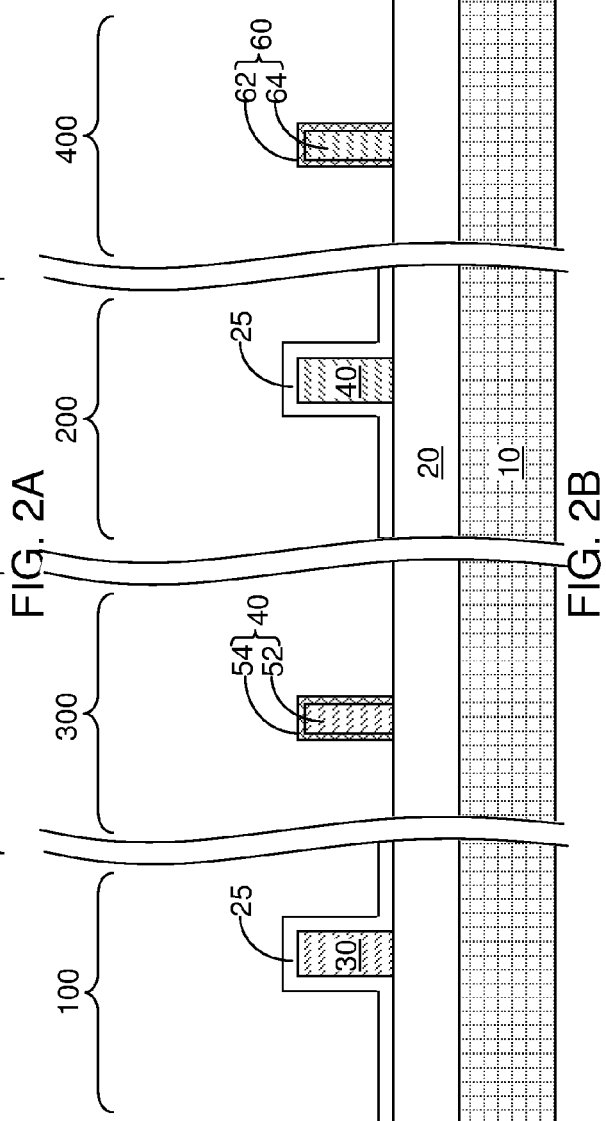
FIG. 2A
FIG. 2B

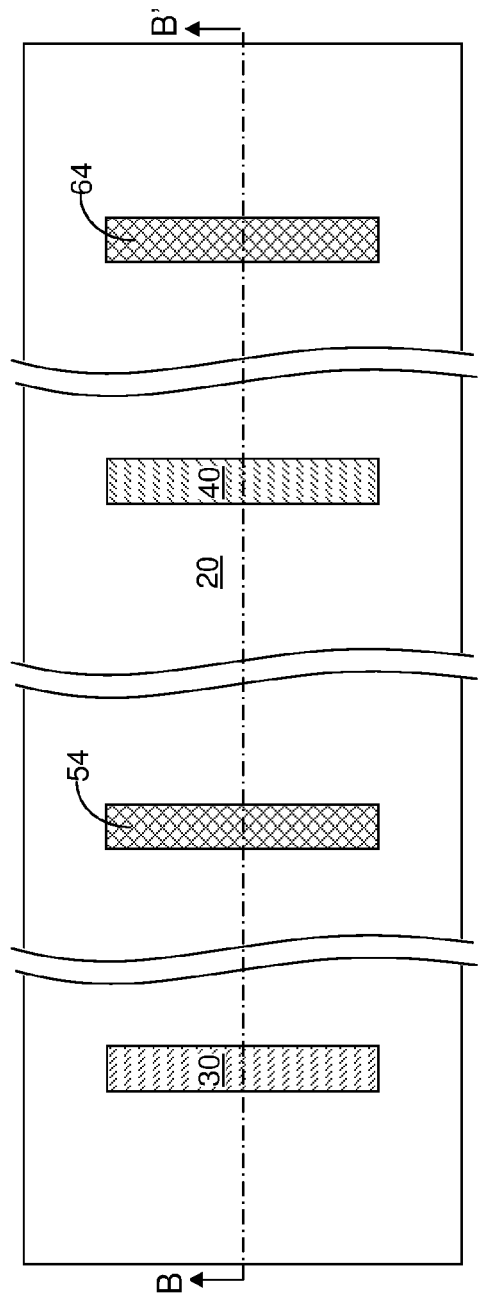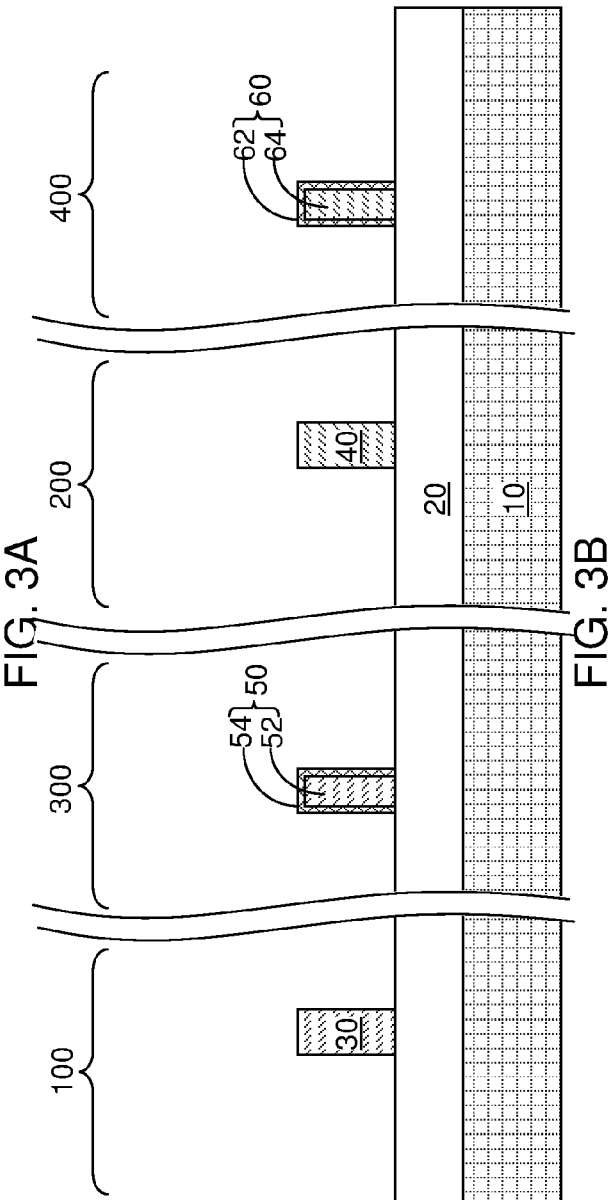

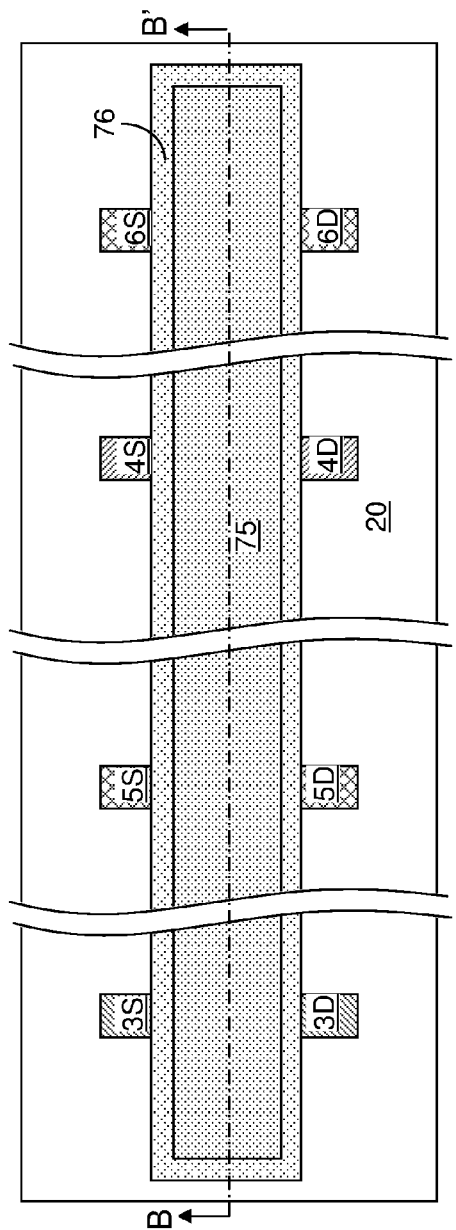
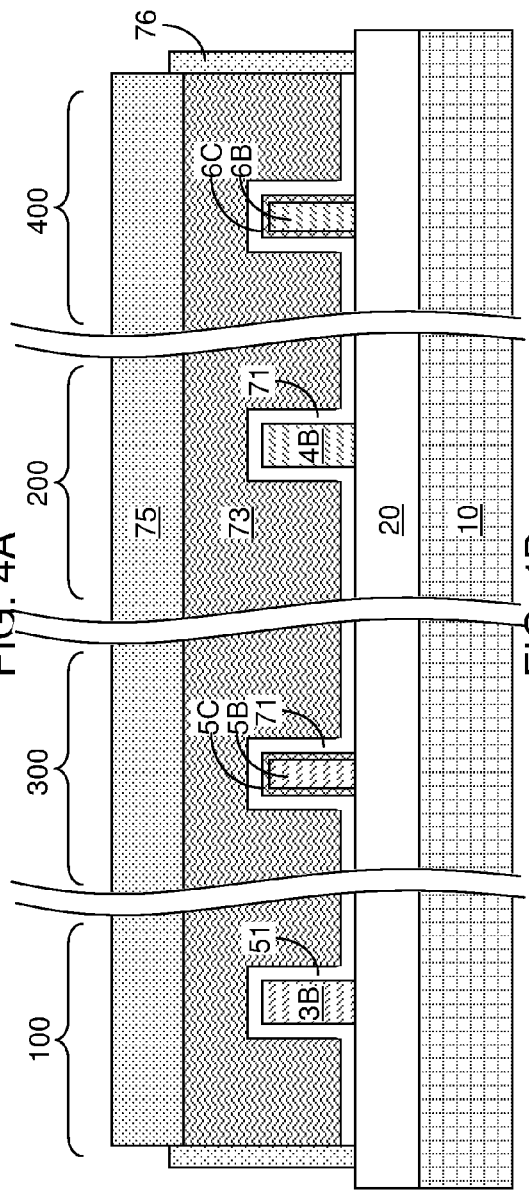
FIG. 4A
FIG. 4B

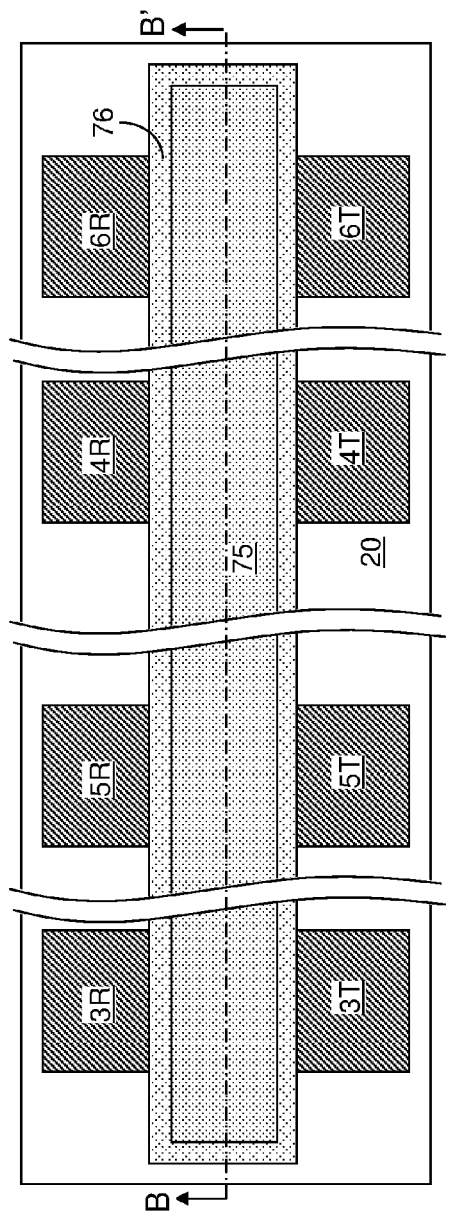
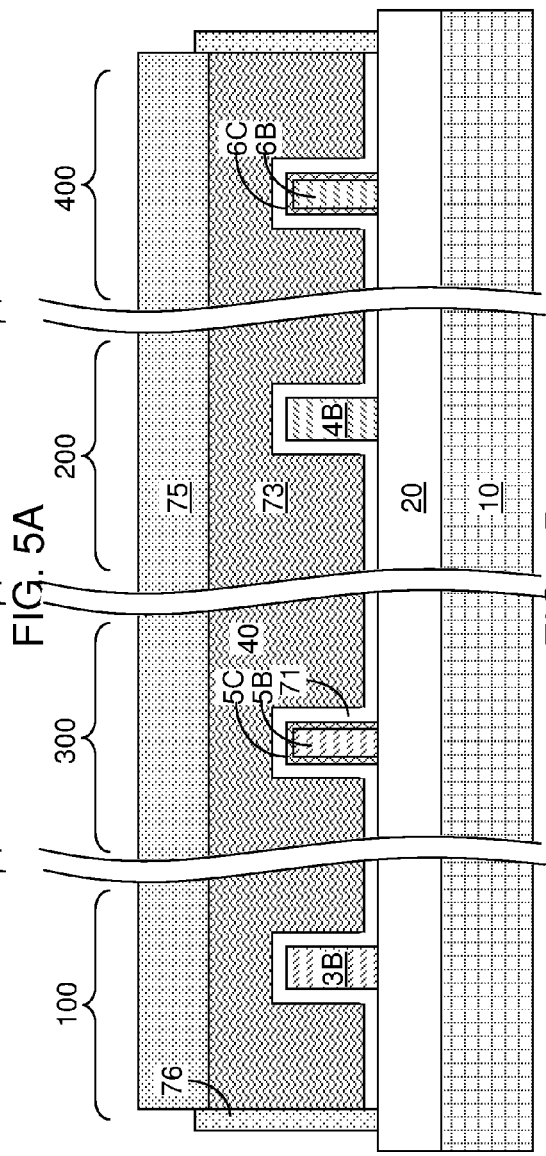
FIG. 5A
FIG. 5B

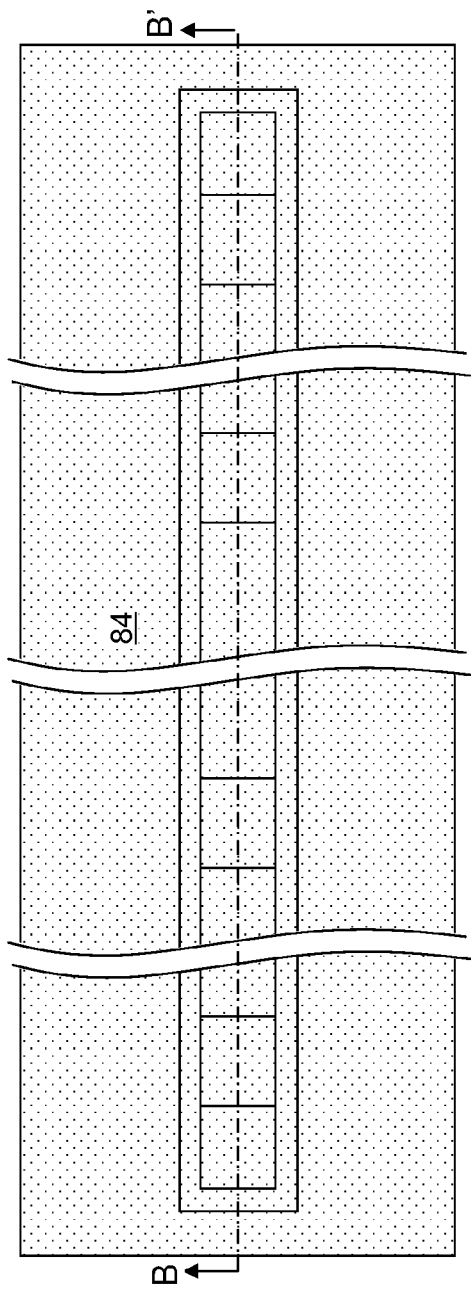
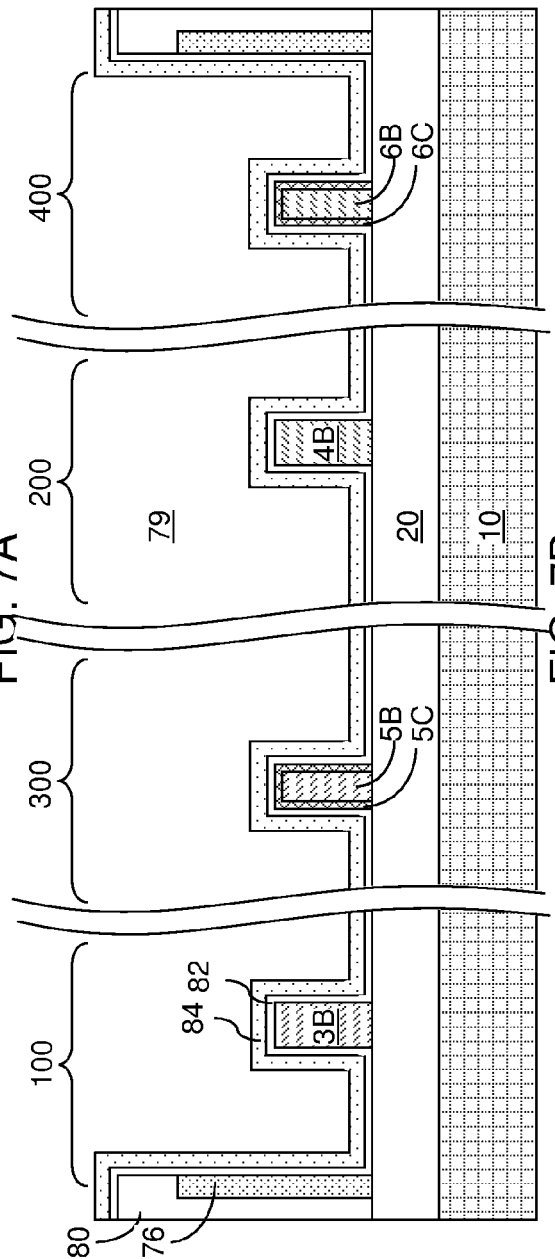

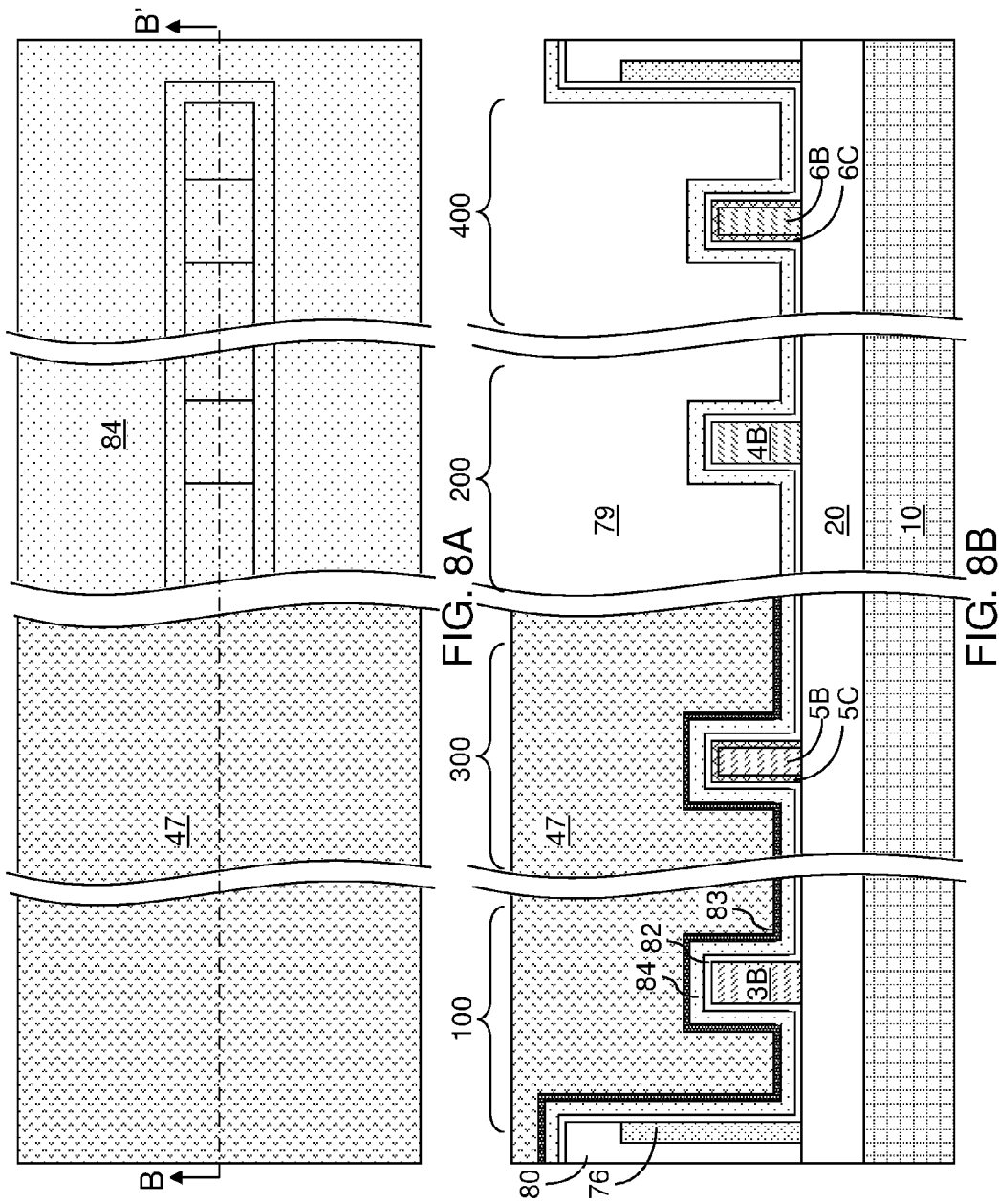

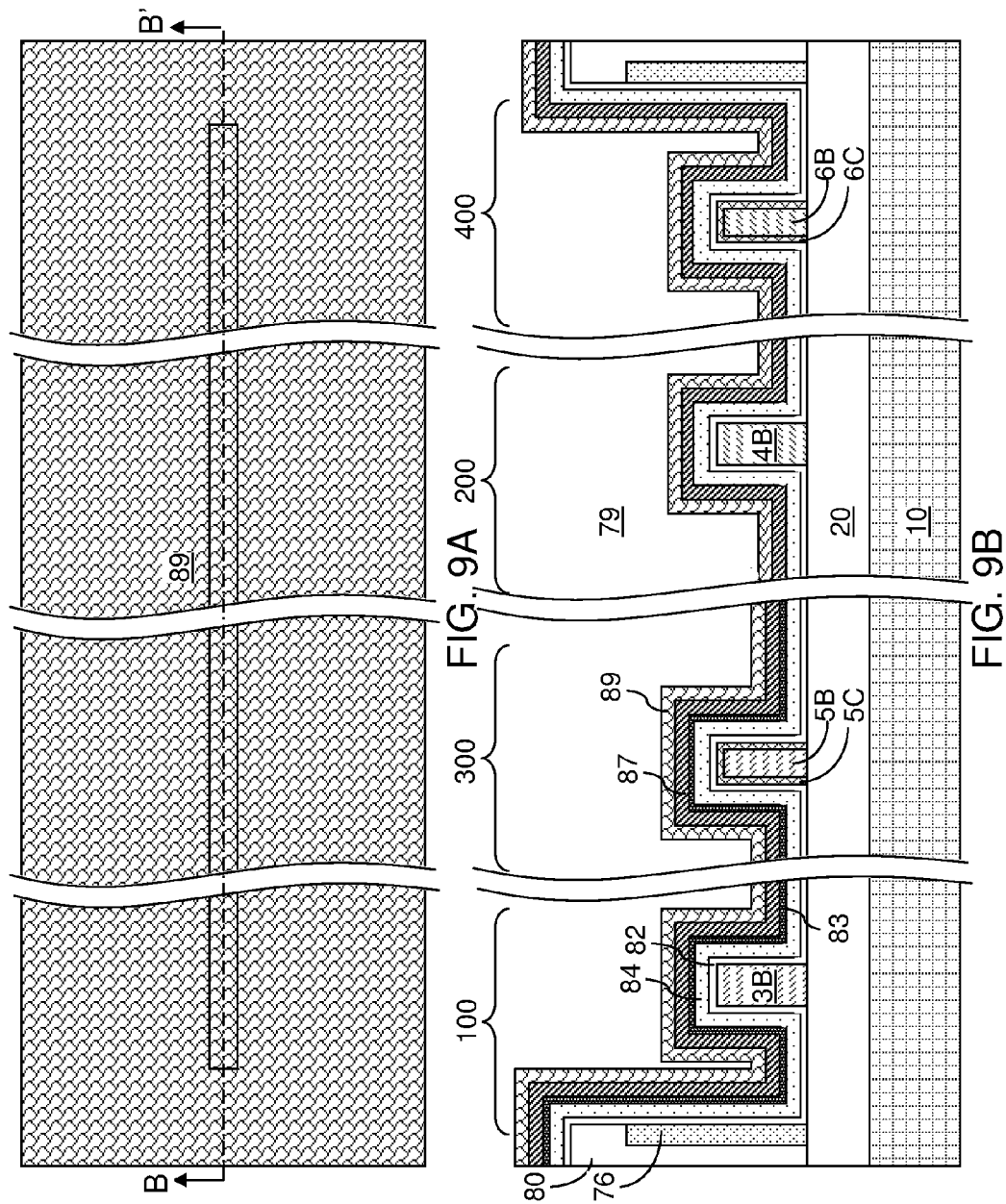

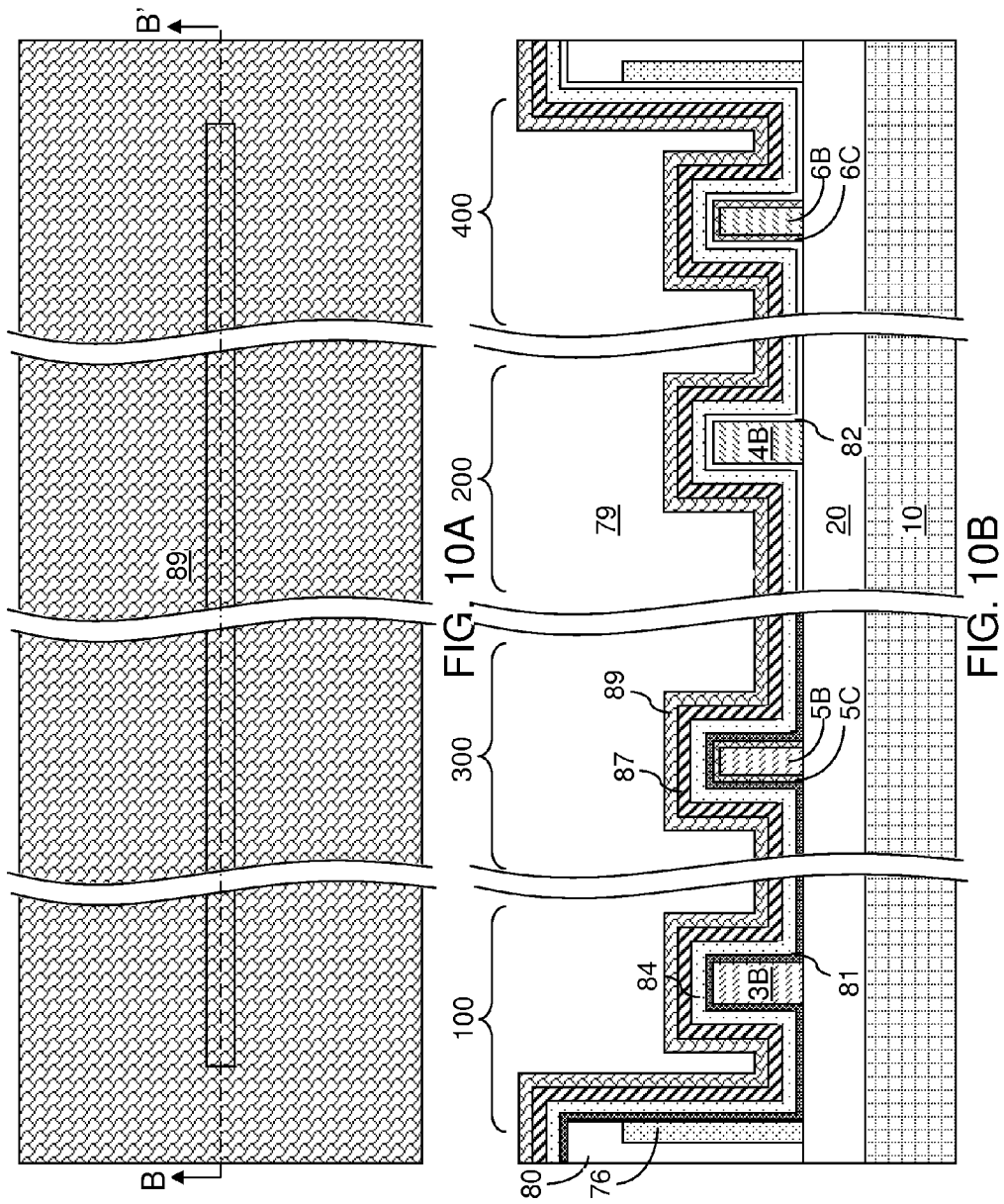

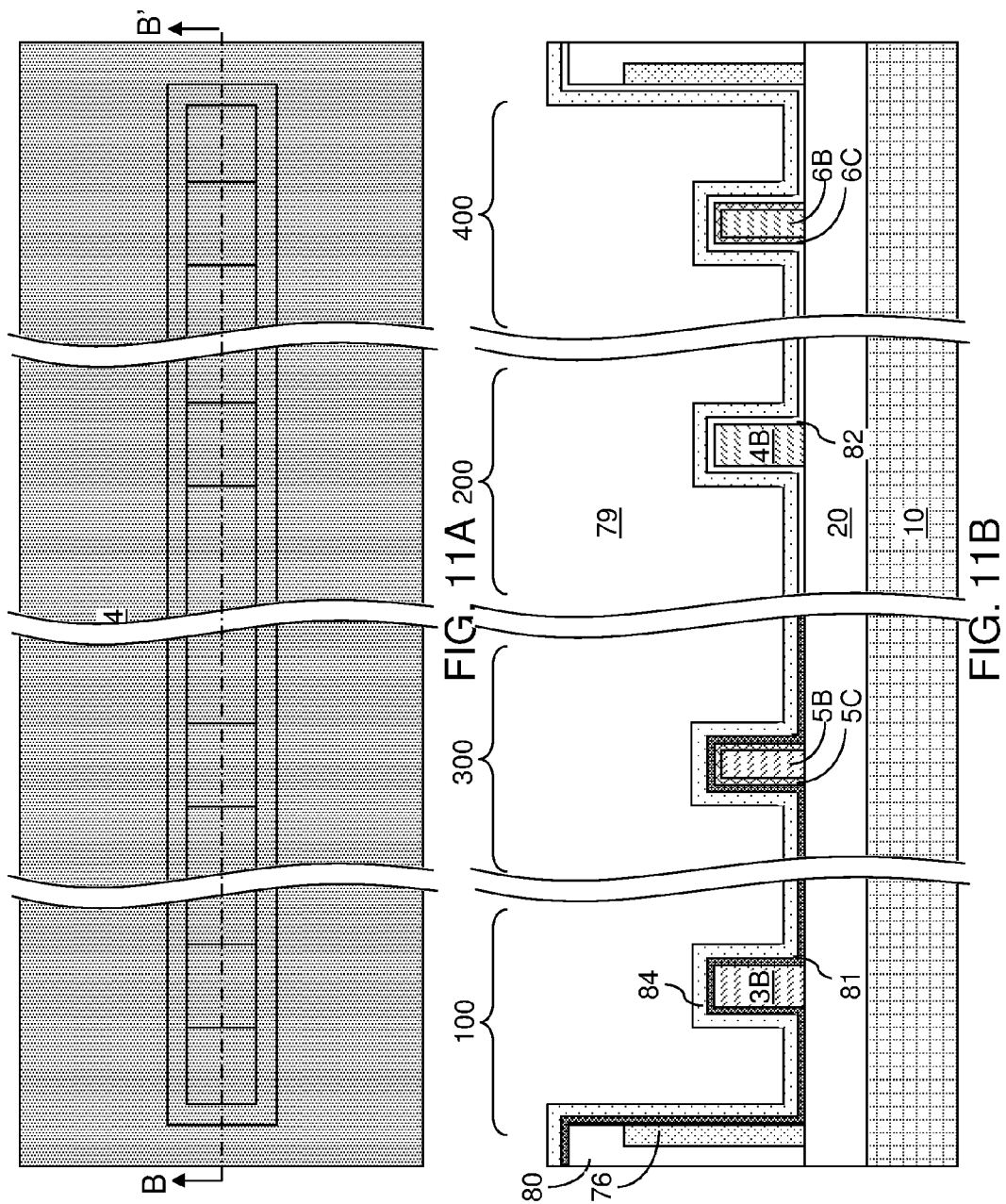

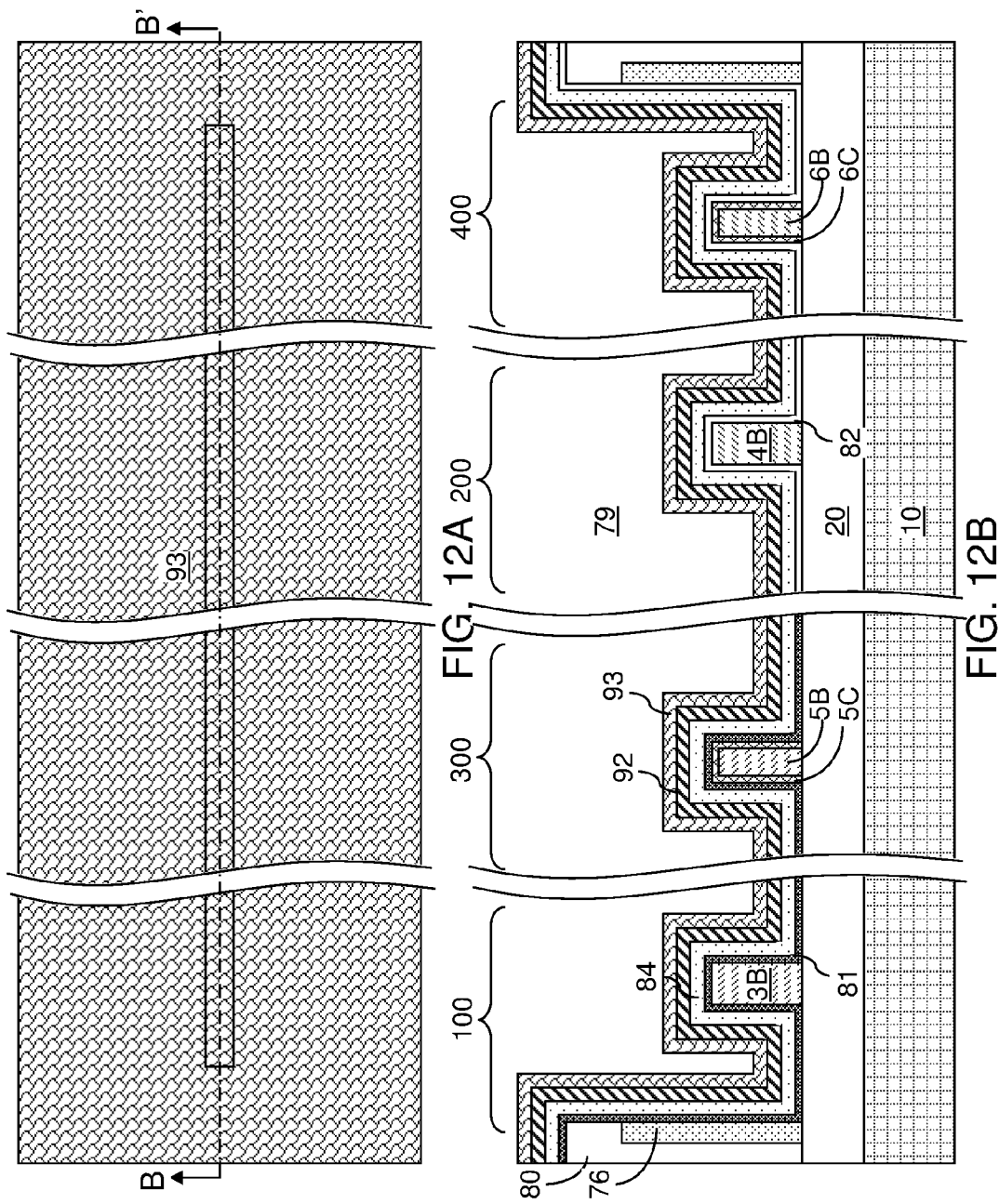

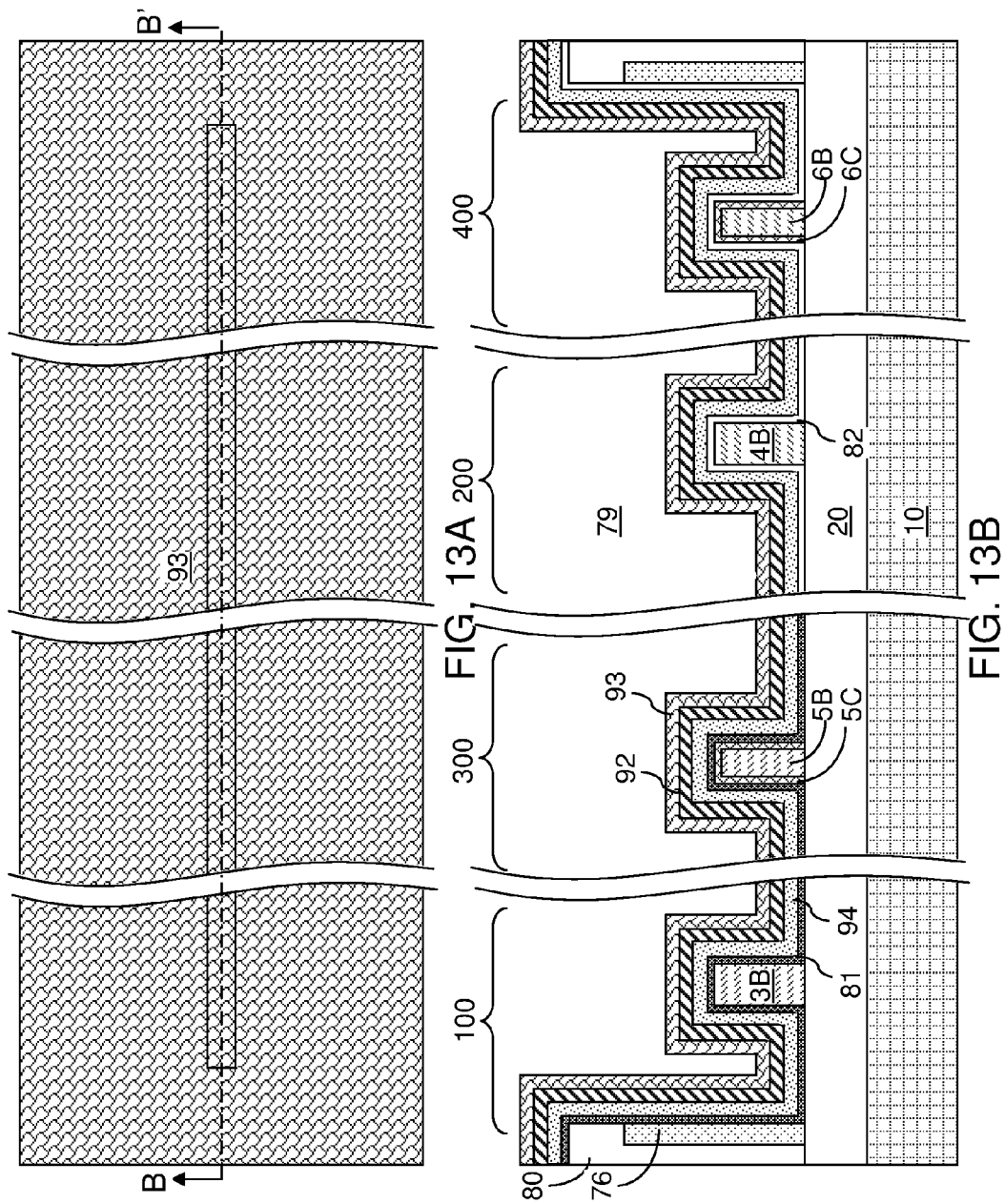

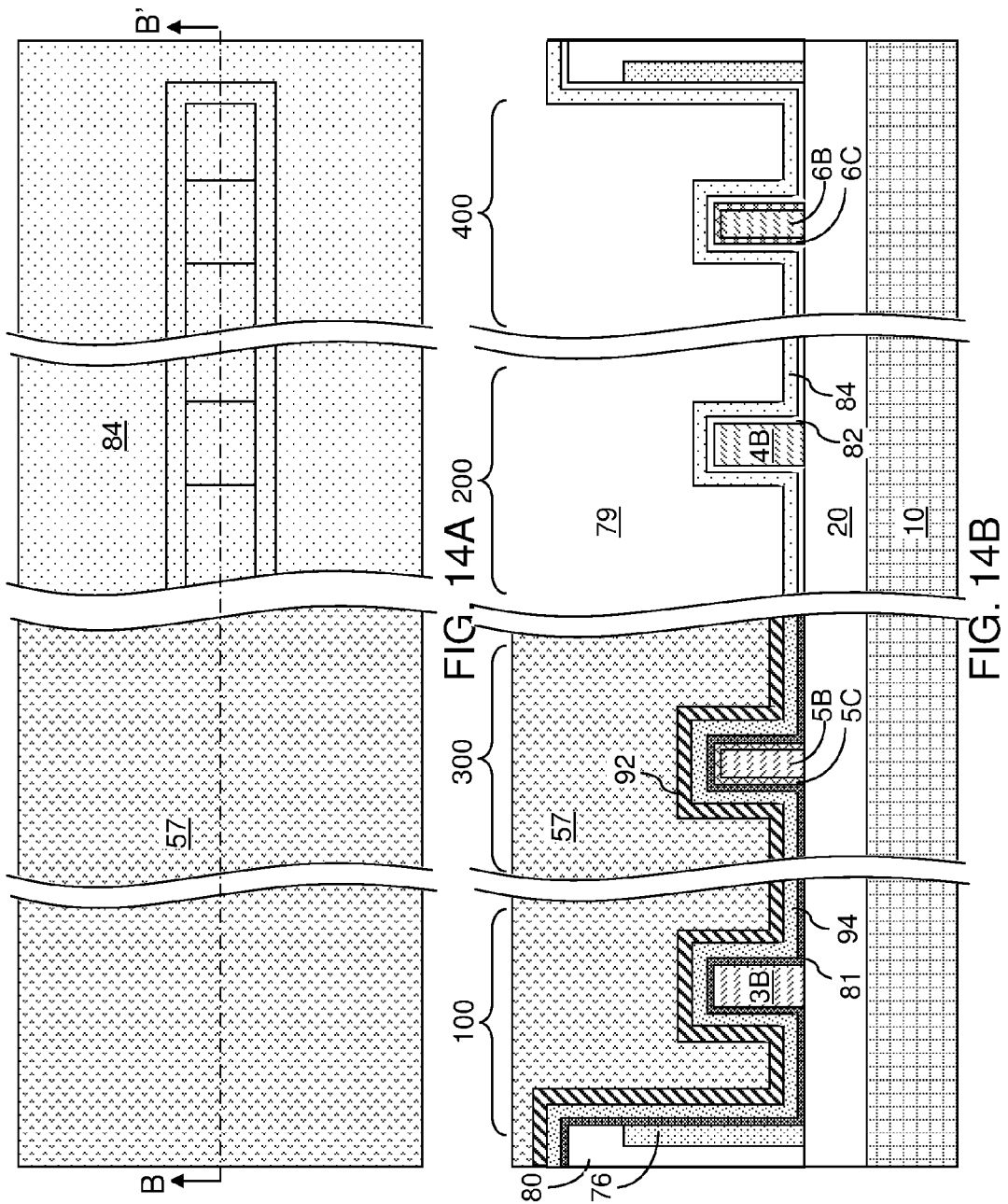

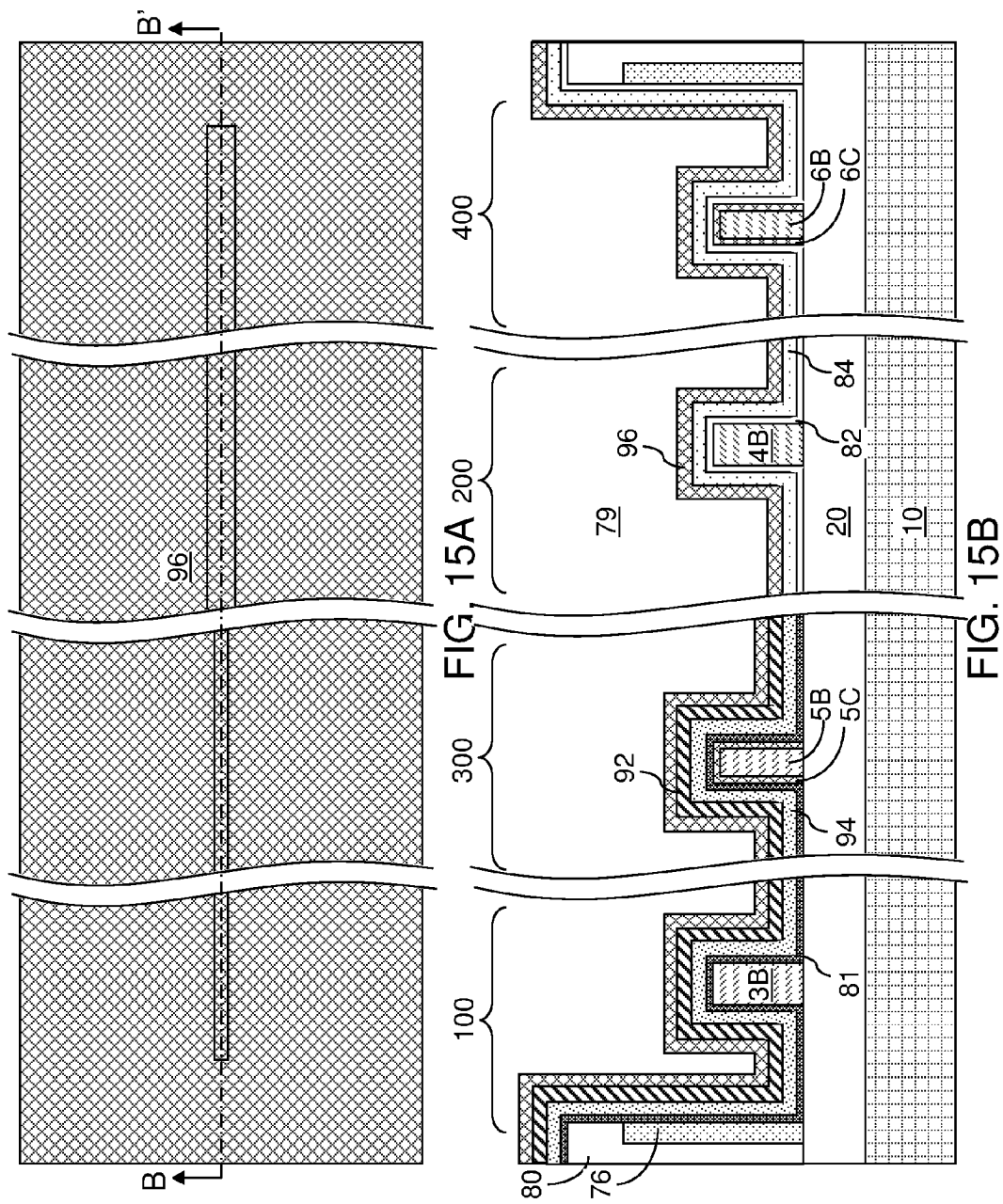

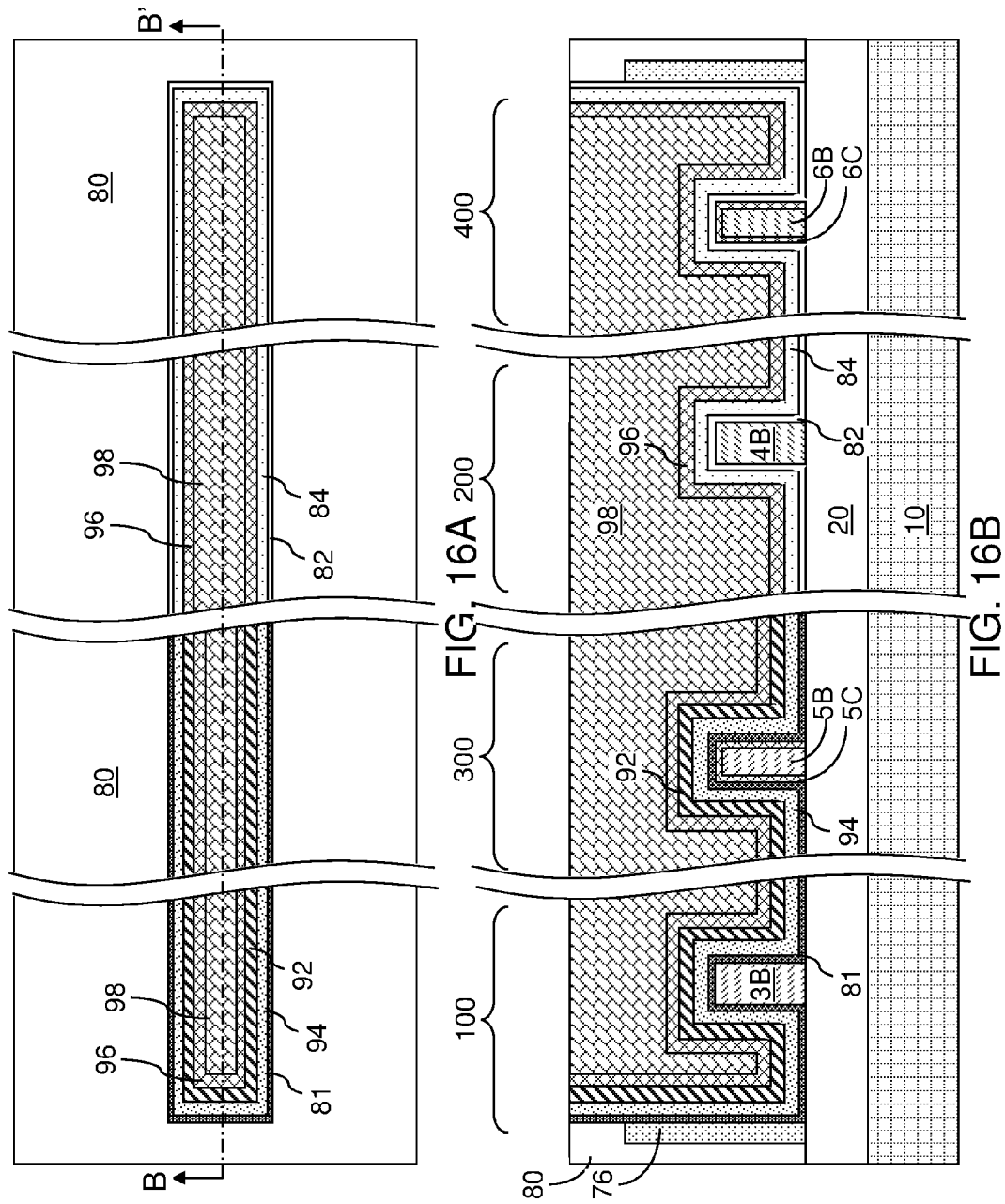

FIELD EFFECT TRANSISTORS HAVING MULTIPLE EFFECTIVE WORK FUNCTIONS

BACKGROUND

The present disclosure generally relates to semiconductor devices, and particularly to semiconductor structures including field effect transistors having multiple effective work functions, and methods of manufacturing the same.

Advanced semiconductor circuits employ multiple types of field effect transistors having different threshold voltages. While methods of employing ion implantation to alter the channel doping for the purpose of providing different threshold voltages are known in the art, control of threshold voltages through ion implantation alone does not provide a full range of variations in the threshold voltage that is desired from field effect transistors. Thus, an integration scheme is desired that can provide a wider range of threshold voltages for various field effect transistors.

SUMMARY

Selective deposition of a silicon-germanium surface layer on semiconductor surfaces can be employed to provide two types of channel regions for field effect transistors. A silicon-based gate dielectric layer and a high dielectric constant (high-k) dielectric layer can be formed on the channel regions, and an adjustment oxide layer can be formed on a subset of surfaces of the high-k dielectric layer by deposition and patterning. Employing capping and a drive-in anneal, the adjustment oxide layer can diffuse through the high-k dielectric layer to form an interfacial adjustment oxide layer contacting channel regions. Oxygen deficiency can be induced in portions of the high-k dielectric layer overlying the interfacial adjustment oxide layer by deposition of a first work function metallic material layer and a capping layer and a subsequent anneal. After removal of the capping layer and patterning of the first work function metallic material layer, oxygen deficiency can be selectively removed in physically exposed portions of the high-k dielectric layer. A second work function metallic material layer and a gate conductor layer can be deposited and planarized to form gate electrodes that provide multiple effective work functions over the two types of channel regions.

According to an aspect of the present disclosure, a semiconductor structure is provided, which includes a first gate dielectric, a first gate electrode, a second gate dielectric, and a second gate electrode. The first gate dielectric straddles a first semiconductor material portion and contains a stack of an adjustment oxide layer including a silicate of a metal selected from alkaline earth metals, Group IIIB elements, and rare earth metals and a first high dielectric constant (high-k) gate dielectric including a dielectric metal oxide and having a dielectric constant greater than 8.0. The first gate electrode is in contact with the first gate dielectric and contains a first metallic material layer in contact with the first high-k gate dielectric. The second gate electrode straddles a second semiconductor material portion and contains a stack of a semiconductor oxide layer and a second high-k gate dielectric. The first high-k gate dielectric differs in composition from the second high-k gate dielectric by presence of oxygen deficiency in the first high-k gate dielectric. The second gate electrode is in contact with the second gate dielectric and contains a second metallic material layer in contact with the second high-k gate dielectric.

According to another aspect of the present disclosure, a method of forming a semiconductor structure is provided. At least a first semiconductor material portion and a second semiconductor material portion are formed on a substrate. A first dielectric material stack is formed over the first semiconductor material portion, and a second dielectric material stack is formed over the second semiconductor material portion. The first dielectric material stack includes an adjustment oxide layer that includes a silicate of a metal selected from alkaline earth metals, Group IIIB elements, and rare earth metals, and a first portion of a contiguous high dielectric constant (high-k) dielectric layer. The second dielectric material stack includes a semiconductor oxide layer and a second portion of the contiguous high-k dielectric layer. A first metallic material layer and a sacrificial capping layer are formed on the high-k dielectric layer over the first and second dielectric material stacks. Oxygen deficiency is induced in the contiguous high-k dielectric layer employing an anneal in which oxygen supply into the contiguous high-k dielectric layer is blocked by the sacrificial capping layer. A top surface of the second portion of the contiguous high-k dielectric layer is physically exposed by removing a portion of the first metallic material layer, while a remaining portion of the first metallic material layer is present over the first semiconductor material portion. A second metallic material layer is formed directly on the top surface of the second portion of the contiguous high-k dielectric layer and a top surface of the first metallic material layer.

BRIEF DESCRIPTION OF THE SEVERAL VIEWS OF THE DRAWINGS

FIG. 1A is a top-down view of an exemplary semiconductor structure after formation of various semiconductor material portions on a substrate according to an embodiment of the present disclosure.

FIG. 1B is a vertical cross-sectional view of the exemplary semiconductor structure along the vertical plane B-B' in FIG. 1A.

FIG. 2A is a top-down view of the exemplary semiconductor structure after formation and patterning of a dielectric mask layer and selective epitaxy that forms semiconductor shell structures according to an embodiment of the present disclosure.

FIG. 2B is a vertical cross-sectional view of the exemplary semiconductor structure along the vertical plane B-B' in FIG. 2A.

FIG. 3A is a top-down view of the exemplary semiconductor structure after removal of the patterned dielectric mask layer according to an embodiment of the present disclosure.

FIG. 3B is a vertical cross-sectional view of the exemplary semiconductor structure along the vertical plane B-B' in FIG. 3A.

FIG. 4A is a top-down view of the exemplary semiconductor structure after formation a disposable gate structure, various source and drain regions, and at least one gate spacer according to an embodiment of the present disclosure.

FIG. 4B is a vertical cross-sectional view of the exemplary semiconductor structure along the vertical plane B-B' in FIG. 4A.

FIG. 5A is a top-down view of the exemplary semiconductor structure after formation and patterning of a dielectric mask layer and selective epitaxy that forms semiconductor shell structures according to an embodiment of the present disclosure.

FIG. 5B is a vertical cross-sectional view of the exemplary semiconductor structure along the vertical plane B-B' in FIG. 5A.

FIG. 7A is a top-down view of the exemplary semiconductor structure after formation of a gate cavity by removal of the disposable gate structure and deposition of at least one semiconductor oxide layer and a contiguous high dielectric constant (high-k) dielectric layer according to an embodiment of the present disclosure.

FIG. 7B is a vertical cross-sectional view of the exemplary semiconductor structure along the vertical plane B-B' in FIG. 7A.

FIG. 8A is a top-down view of the exemplary semiconductor structure after formation and patterning of a dielectric oxide material layer according to an embodiment of the present disclosure.

FIG. 8B is a vertical cross-sectional view of the exemplary semiconductor structure along the vertical plane B-B' in FIG. 8A.

FIG. 9A is a top-down view of the exemplary semiconductor structure after formation of first sacrificial capping layers according to an embodiment of the present disclosure.

FIG. 9B is a vertical cross-sectional view of the exemplary semiconductor structure along the vertical plane B-B' in FIG. 9A.

FIG. 10A is a top-down view of the exemplary semiconductor structure after formation of an adjustment oxide layer by an anneal according to an embodiment of the present disclosure.

FIG. 10B is a vertical cross-sectional view of the exemplary semiconductor structure along the vertical plane B-B' in FIG. 10A.

FIG. 11A is a top-down view of the exemplary semiconductor structure after removal of the first sacrificial capping layers according to an embodiment of the present disclosure.

FIG. 11B is a vertical cross-sectional view of the exemplary semiconductor structure along the vertical plane B-B' in FIG. 11A.

FIG. 12A is a top-down view of the exemplary semiconductor structure after formation of a first metallic material layer and a second sacrificial capping layer according to an embodiment of the present disclosure.

FIG. 12B is a vertical cross-sectional view of the exemplary semiconductor structure along the vertical plane B-B' in FIG. 12A.

FIG. 13A is a top-down view of the exemplary semiconductor structure after formation of oxygen vacancies in the contiguous high-k gate dielectric layer according to an embodiment of the present disclosure.

FIG. 13B is a vertical cross-sectional view of the exemplary semiconductor structure along the vertical plane B-B' in FIG. 13A.

FIG. 14A is a top-down view of the exemplary semiconductor structure after removal of the second sacrificial capping layer and patterning of the first metallic material layer according to an embodiment of the present disclosure.

FIG. 14B is a vertical cross-sectional view of the exemplary semiconductor structure along the vertical plane B-B' in FIG. 14A.

FIG. 15A is a top-down view of the exemplary semiconductor structure after formation of a second metallic material layer according to an embodiment of the present disclosure.

FIG. 15B is a vertical cross-sectional view of the exemplary semiconductor structure along the vertical plane B-B' in FIG. 15A.

FIG. 16A is a top-down view of the exemplary semiconductor structure after formation of gate electrodes according to an embodiment of the present disclosure.

FIG. 16B is a vertical cross-sectional view of the exemplary semiconductor structure along the vertical plane B-B' in FIG. 16A.

DETAILED DESCRIPTION

Figure 6A:
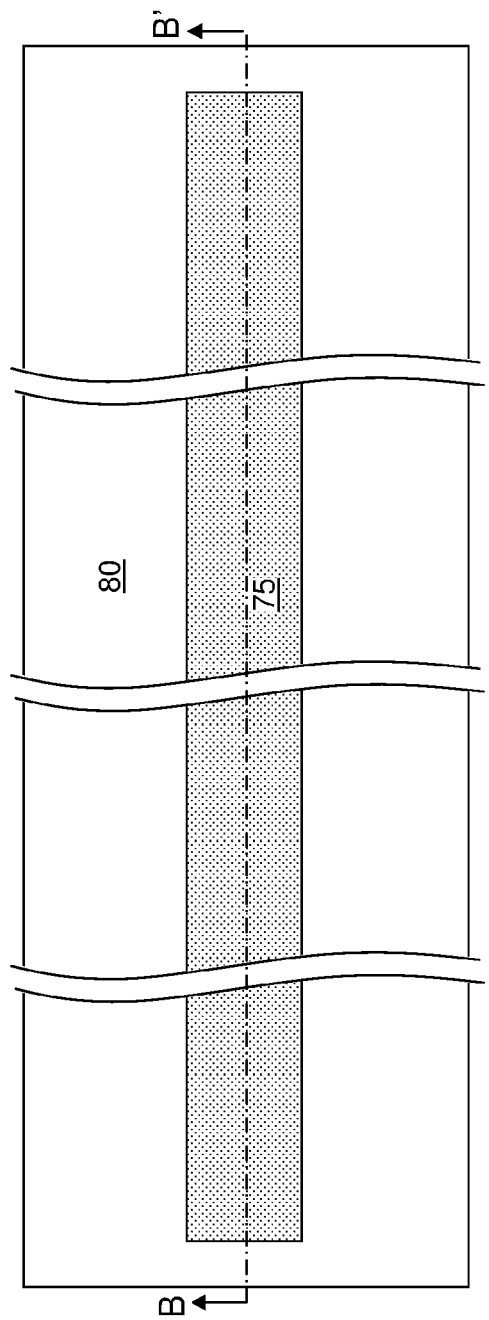
FIG. 6A is a top-down view of the exemplary semiconductor structure after deposition and planarization of a planarization dielectric layer according to an embodiment of the present disclosure.

As stated above, the present disclosure relates to semiconductor structures including field effect transistors having multiple effective work functions, and methods of manufacturing the same. Aspects of the present disclosure are now described in detail with accompanying figures. Like and corresponding elements mentioned herein and illustrated in the drawings are referred to by like reference numerals. The drawings are not necessarily drawn to scale. As used herein, ordinals such as "first," "second," and "third" are employed merely to distinguish similar elements, and different ordinals may be employed to designate a same element in the specification and/or claims.

As used herein, a field effect transistor refers to any planar transistor having a gate electrode overlying a horizontal planar channel, any fin field effect transistor having a gate electrode located on sidewalls of a semiconductor fin, or any other types of metal-oxide semiconductor field effect transistor (MOSFETs) and junction field effect transistors (JFETs).

Referring to FIGS. 1A and 1B, an exemplary semiconductor structure according to an embodiment of the present disclosure includes various semiconductor material portions (30, 40, 52, 62) formed on a substrate (10, 20). The various semiconductor material portions (30, 40, 52, 62) can be patterned from a top semiconductor layer of a semiconductor-on-insulator (SOI) substrate, or can be patterned from an upper portion of a bulk semiconductor substrate. The substrate (10, 20) can be a combination of an insulator layer 20 and a handle substrate derived from an SOI substrate, or can be an unpatterned portion of a bulk semiconductor substrate.

The various semiconductor material portions (30, 40, 52, 62) includes at least one semiconductor material. The various semiconductor material portions (30, 40, 52, 62) can include the same semiconductor material, or can include different materials. The semiconductor material(s) of the various semiconductor material portions (30, 40, 52, 62) can be an elemental semiconductor material such as silicon or germanium, a semiconductor alloy including at least one elemental semiconductor material such as a silicon-germanium alloy or a silicon-carbon alloy, a compound semiconductor material, and/or an organic semiconductor material. The semiconductor material(s) of the various semiconductor material portions (30, 40, 52, 62) can be single crystalline. In one embodiment, the semiconductor material(s) of the various semiconductor material portions (30, 40, 52, 62) can be single crystalline silicon.

The height of each semiconductor material portion (30, 40, 52, 62) can be in a range from 10 nm to 500 nm, although lesser and greater heights can also be employed. The width of each semiconductor material portion (30, 40, 52, 62) can be in a range from 30 nm to 1,000 nm, although lesser and greater widths can also be employed. Each semiconductor material portion (30 40, 52, 62) may have the same height, or may have different heights. The length of each semiconductor material portion (30, 40, 52, 62) can be in a range from 100 nm to 10,000 nm, although lesser and greater lengths can also be employed. In one embodiment, the semiconductor material portions (30, 40, 52, 62) can be provided without any intervening dielectric material layer thereamongst. In another embodiment, a shallow trench isolation layer (not shown) may be provided among the various semiconductor material portions (30, 40, 52, 62).

In one embodiment, the various semiconductor material portions (30, 40, 52, 62) can include a first semiconductor material portion 30 formed in a first device region 100, a second semiconductor material portion 40 formed in a second device region 200, a third semiconductor material portion 52 formed in a third device region 300, and a fourth semiconductor material portion 62 formed in a fourth device region 400. In one embodiment, the first, second, third, and fourth semiconductor material portions (30, 40, 52, 62) can include the same semiconductor material, which can be a single crystalline semiconductor material such as silicon.

In one embodiment, the first, second, third, and fourth semiconductor material portions (30, 40, 52, 62) can be semiconductor fins. As used herein, a semiconductor fin refers to a semiconductor material portion having a parallel pair of sidewalls that extend along the lengthwise direction of the semiconductor material portion. As used herein, a lengthwise direction of an element refers to an element along which an axis of rotation passing through the center of mass of the element has the least moment of inertia. The lengthwise direction of each semiconductor fin can be along a horizontal direction.

Referring to FIGS. 2A and 2B, a dielectric mask layer 25 can be deposited on the surfaces of the various semiconductor material portions (30 40, 52, 62), and subsequently patterned to cover one set of semiconductor material portions (30, 40), while not covering another set of semiconductor material portions (52, 62). The dielectric mask layer 25 includes a dielectric material such as silicon nitride, silicon oxynitride, silicon oxide, a dielectric metal oxide, a dielectric metal nitride, or a combination thereof. The dielectric mask layer 25 can be deposited, for example, by chemical vapor deposition or atomic layer deposition. In one embodiment, the first semiconductor material portion 30 and the second semiconductor material portion 40 can be covered by the dielectric mask layer 25 after patterning of the dielectric mask layer 25, and the third semiconductor material portion 52 and the fourth semiconductor material portion 62 can be physically exposed to an ambient after patterning of the dielectric mask layer 25.

In one embodiment, the semiconductor materials of the firsts, second, third, and fourth semiconductor material portions (30, 40, 52, 62) can be a same semiconductor material, which is herein referred to as a first semiconductor material. A semiconductor material different in composition than the first semiconductor material can be deposited on the surfaces of the third and fourth semiconductor material portions (52, 62) by selective epitaxy of a semiconductor material having a different composition than the first semiconductor material. For example, the first semiconductor material can be single crystalline silicon, and the second semiconductor material can be a single crystalline silicon-germanium alloy. A first semiconductor shell structure 54 can be formed on the sidewall surfaces and the top surface of the third semiconductor material portion 52 by selective epitaxial deposition of the second semiconductor material. A second semiconductor shell structure 64 can be formed on the sidewall surfaces and the top surface of the fourth semiconductor material portion 62 by selective epitaxial deposition of the second semiconductor material. As used herein, a "shell structure" refers to a structure that laterally encloses another structure.

The first semiconductor shell structure 54 can be single crystalline, and in epitaxial alignment with the single crystalline first semiconductor material of the third semiconductor material portion 52. The first semiconductor shell structure 54 embeds the third semiconductor material portion 52. The second semiconductor shell structure 64 can be single crystalline, and in epitaxial alignment with the single crystalline first semiconductor material of the fourth semiconductor material portion 62. The second semiconductor shell structure 64 embeds the fourth semiconductor material portion 62. The combination of the third semiconductor material portion 52 and the first semiconductor shell structure 54 constitutes a first semiconductor material stack 50. The combination of the fourth semiconductor material portion 62 and the second semiconductor shell structure 64 constitutes a second semiconductor material stack 60.

Referring to FIGS. 3A and 3B, after formation of the first and second semiconductor shell structures (54, 64), the dielectric mask layer 25 can be removed, for example, by a wet etch. In one embodiment, the dielectric mask layer 25 can be removed selective to the dielectric material of the insulator layer 20.

Referring to FIGS. 4A and 4B, at least one disposable material layer can be deposited and patterned employing a combination of lithographic methods and at least one anisotropic etch to form at least one disposable gate structure (71, 73, 75). In one embodiment, the at least one disposable material layer can include, from bottom to top, a disposable dielectric layer, a disposable gate material layer, and a disposable cap layer. The disposable dielectric layer includes a dielectric material that can be removed selective to the semiconductor material portions (30, 40) and the semiconductor material stacks (50, 60). For example, the disposable dielectric layer can include silicon oxide, silicon nitride, a dielectric metal oxide, or a combination thereof. The thickness of the disposable dielectric layer can be in a range from 1 nm to 10 nm, although lesser and greater thicknesses can also be employed. The disposable gate material layer can include a material that can be subsequently removed selective to the dielectric material of the disposable dielectric layer. For example, the disposable gate material layer can include a semiconductor material, amorphous carbon, an organic material, or a metallic material. The thickness of the disposable gate material layer depends on the target height of a replacement gate structure to be subsequently formed, and can be in a range from 100 nm to 500 nm, although lesser and greater heights can also be employed. The disposable cap layer can include a dielectric material such as silicon nitride. The thickness of the disposable cap layer depends on the height of the semiconductor material portions (30, 40) and the semiconductor material stacks (50, 60) if the semiconductor material portions (30, 40) and the semiconductor material stacks (50, 60) are semiconductor fins, and may otherwise depend on the anticipated erosion during subsequent planarization of a planarization dielectric layer.

The vertical stack of the disposable dielectric layer, the disposable gate material layer, and the disposable cap layer can be patterned, for example, by application of a photoresist layer on the top surface of the disposable cap layer, lithographic patterning of the photoresist layer, and an anisotropic etch that etches the materials of the vertical stack in areas that are not covered by the photoresist layer. The photoresist layer can be subsequently removed, for example, by ashing. Each disposable gate structure (71, 73, 75) can include, from bottom to top, a disposable dielectric portion 71, a disposable gate material portion 73, and a disposable gate cap 75. Each disposable dielectric portion 71 is a remaining portion of the disposable dielectric layer, each disposable gate material portion 73 is a remaining portion of the disposable gate material layer, and each disposable gate cap 75 is a remaining portion of the disposable gate cap layer. Each disposable gate structure (71, 73, 75) straddles at least one of the semiconductor material portions (30, 40) or the semiconductor material stacks (50, 60). A disposable gate structure (71, 73, 75) may straddle only one of the semiconductor material portions (30, 40) or the semiconductor material stacks (50, 60), or may straddle a plurality of the semiconductor material portions (30, 40) and/or the semiconductor material stacks (50, 60).

A gate spacer 76 including a dielectric material can be optionally formed around each disposable gate structure (71, 73, 75), for example, by conformal deposition of at least one dielectric material and an anisotropic etch. The at least one dielectric material can include silicon oxide, silicon nitride, or a combination thereof. While the present disclosure is described employing an embodiment in which the gate spacers 76 are formed prior to formation of source regions and drain region, embodiments are expressly contemplated herein in which at least a portion of source regions and drain regions is formed prior to formation of the gate spacers 76.

Source regions (3S, 4S, 5S, 6S) and drain regions (3D, 4D, 5D, 6D) can be formed in the first and second semiconductor material portions (30, 40; See FIGS. 3A and 3B) and the first and second semiconductor material stacks (50, 60; See FIGS. 3A and 3B) employing methods known in the art. A first source region 3S and a first drain region 3D can be formed in the first semiconductor material portion (3S, 3D, 3B) by introduction of electrical dopants of a first conductivity type, which can be p-type or n-type. The sub-portion of the first semiconductor material portion 30 into which the electrical dopants of the first conductivity type are not introduced constitutes a first body region 3B. A surface portion of the first body region 3B is a first channel region (not specifically shown). In one embodiment, p-n junctions can be formed between the first body region 3B and the first source and drain regions (3S, 3D).

A third source region 5S and a third drain region 5D can be formed in the first semiconductor material stack (5S, 5D, 5B, 5C) by introduction of electrical dopants of the first conductivity type. The portion of the first semiconductor material stack 50 into which the electrical dopants of the first conductivity type are not introduced constitutes a third body region (5B, 5C). The portion of the third body region (5B, 5C) that includes the second semiconductor material can be a third channel region 5C. In one embodiment, p-n junctions can be formed between the third body region (5B, 5C) and the third source and drain regions (5S, 5D). In one embodiment, the first source region 3S, the third source region 5S, the first drain region 3D, and the third drain region 5D can be formed simultaneously.

A second source region 4S and a second drain region 4D can be formed in the second semiconductor material portion (4S, 4D, 4B) by introduction of electrical dopants of a second conductivity type. The second conductivity type can be the opposite of the first conductivity type. For example, if the first conductivity type is p-type, the second conductivity type is n-type, and vice versa. The sub-portion of the second semiconductor material portion (4S, 4D, 4B) into which the electrical dopants of the second conductivity type are not introduced constitutes a second body region 4B. A surface portion of the second body region 4B is a first channel region (not specifically shown). In one embodiment, p-n junctions can be formed between the second body region 4B and the second source and drain regions (4S, 4D). Alternatively, the first body region 3B and/or the second body region 4B may be intrinsic.

A fourth source region 6S and a fourth drain region 6D can be formed in each second semiconductor material portion (6S, 6D, 6B, 6C) by introduction of electrical dopants of the second conductivity type. Each portion of the second semiconductor material stack (6S, 6D, 6B, 6C) into which the electrical dopants of the second conductivity type are not introduced constitutes a second body region (6B, 6C). The portion of the fourth body region (6B, 6C) that includes the second semiconductor material can be a fourth channel region 6C. In one embodiment, p-n junctions can be formed between the second body region (6B, 6C) and the fourth source and drain regions (6S, 6D). Alternatively, the third body region (5B, 5C) and/or the fourth body region (6B, 6C) may be intrinsic. In one embodiment, the second source region 4S, the fourth source region 6S, the second drain region 4D, and the fourth drain region 6D can be formed simultaneously.

Referring to FIGS. 5A and 5B, raised source regions (3R, 4R, 5R, 6R) and raised drain regions (3T, 4T, 5T, 6T) can be optionally formed by selective deposition of doped semiconductor materials. At least one disposable dielectric masking layer (not shown) may be employed to induce deposition of semiconductor materials only in desired regions. Specifically, first and third raised source regions (3S, 5S) and first and fourth raised drain regions (3T, 5T) can be formed on the first and third source regions (3S, 5S) and the first and third drain regions (3D, 5D), respectively. The first and third raised source regions (3S, 5S) and the first and fourth raised drain regions (3T, 5T) can have a doping of the first conductivity type. Second and fourth raised source regions (4S, 6S) and second and fourth raised drain regions (4T, 6T) can be formed on the second and fourth source regions (4S, 6S) and the second and fourth drain regions (4D, 6D), respectively. The second and fourth raised source regions (4S, 6S) and the second and fourth raised drain regions (4T, 6T) can have a doping of the second conductivity type. Optionally, metal semiconductor alloy regions (not shown) can be formed on the physically exposed surfaces of the raised source and drain regions (3R, 4R, 5R, 6R, 3T, 4T, 5T, 6T), or, if raised source and drain regions are not formed, on the physically exposed surfaces of the source and drain regions (3S, 4S, 5S, 6S, 3D, 4D, 5D, 6D).

Figure 6B:
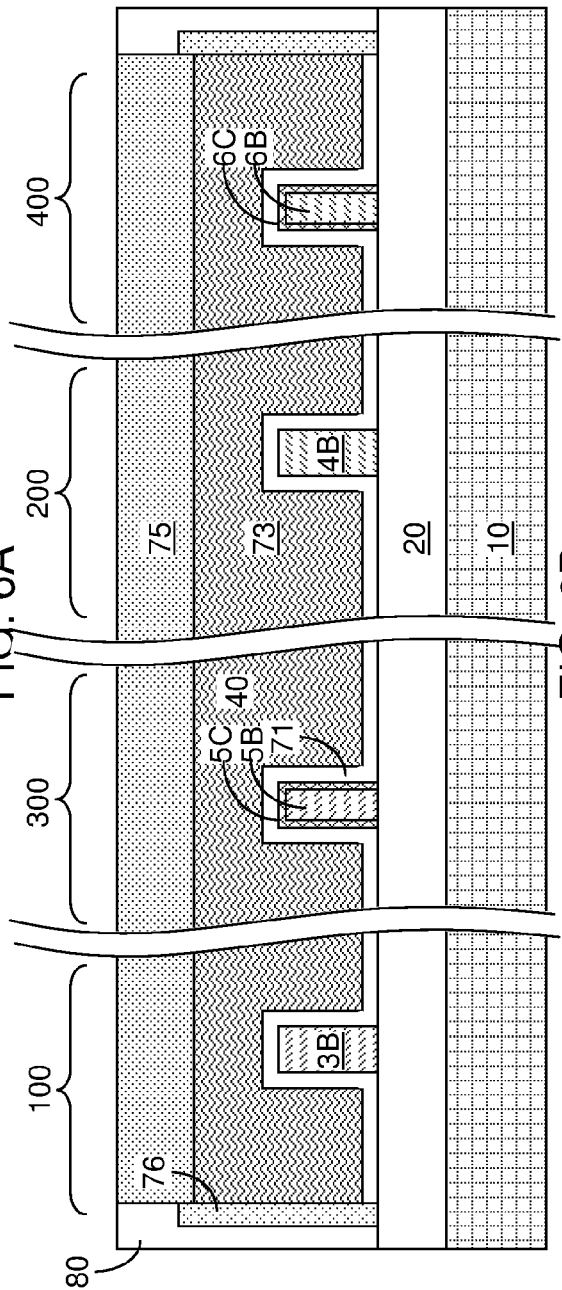
FIG. 6B is a vertical cross-sectional view of the exemplary semiconductor structure along the vertical plane B-B' in FIG. 6A.

Referring to FIGS. 6A and 6B, a planarization dielectric layer 60 is deposited over the disposable gate structures (71, 73, 75), the semiconductor material portions (3S, 3D, 3B, 4S, 4D, 4B), and the semiconductor material stacks (5S, 5D, 5B, 5C, 6S, 6D, 6B, 6C), and can be subsequently planarized employing the disposable cap portions 75 as stopping layers. The planarization dielectric layer 60 includes a dielectric material that may be easily planarized. For example, the planarization dielectric layer 60 can be composed of a doped silicate glass or an undoped silicate glass (silicon oxide). The planarization can be performed, for example, by chemical mechanical planarization (CMP). The planarization dielectric layer 60 laterally surrounds the semiconductor material portions (3S, 3D, 3B, 4S, 4D, 4B), the semiconductor material stacks (5S, 5D, 5B, 5C, 6S, 6D, 6B, 6C), and the disposable gate structure (71, 73, 75).

Referring to FIGS. 7A and 7B, the at least one disposable gate structure (71, 73, 75) can be removed by at least one etch. The at least one etch can be a recess etch, which can be an isotropic etch or anisotropic etch. The etch processes employed to remove the at least one disposable gate cap 75 and the at least one disposable gate material portion 73 can be selective to the dielectric materials of the planarization dielectric layer 60. The etch chemistry employed to remove the at least one disposable dielectric portion 71 can be selective to the semiconductor materials of the semiconductor material portions (3S, 3D, 3B, 4S, 4D, 4B) and the semiconductor material stacks (5S, 5D, 5B, 5C, 6S, 6D, 6B, 6C). Thus, the at least one disposable gate structure (71, 73, 75) can be removed selective to the planarization dielectric layer 60 and to the semiconductor material portions (3S, 3D, 3B, 4S, 4D, 4B) and the semiconductor material stacks (5S, 5D, 5B, 5C, 6S, 6D, 6B, 6C). A gate cavity 79 is formed in each volume from which a disposable gate structure (71, 73, 75) is removed. Each gate cavity 79 can be laterally enclosed by a gate spacer 76 and the planarization dielectric layer 60.

A semiconductor oxide layer 82 can be formed directly on the physically exposed sidewalls and top surfaces of the semiconductor material portions (3S, 3D, 3B, 4S, 4D, 4B) and the semiconductor material stacks (5S, 5D, 5B, 5C, 6S, 6D, 6B, 6C) within the gate cavity 79. The semiconductor oxide layer 82 is a layer of a semiconductor oxide material, and may be formed as a single contiguous layer, for example, by deposition of a semiconductor oxide material by a conformal deposition method, or may be formed as disjoined semiconductor oxide portions, for example, by thermal oxidation or plasma oxidation of the surface portions of the semiconductor material portions (3S, 3D, 3B, 4S, 4D, 4B) and the semiconductor material stacks (5S, 5D, 5B, 5C, 6S, 6D, 6B, 6C) within the gate cavity 79. As used herein, a semiconductor oxide refers to a dielectric oxide or a dielectric oxynitride of a semiconductor material. Exemplary semiconductor oxides include silicon oxide, silicon oxynitride, an oxide of a silicon-germanium alloy, and an oxynitride of a silicon-germanium alloy. The thickness of the semiconductor oxide layer 82 can be in a range from 0.5 nm to 2.0 nm, although lesser and greater thicknesses can also be employed.

A high dielectric constant (high-k) dielectric layer 84 can be formed as a contiguous dielectric layer directly on the surfaces of the semiconductor oxide layer 82. The high-k dielectric layer 84 includes a material commonly known as a "high dielectric constant material." A "high dielectric constant material," or a "high-k dielectric material," herein refers to a dielectric material having a dielectric constant greater than 8.0. In one embodiment, the high-k dielectric layer 84 can include a dielectric metal oxide, which is a high-k material containing a metal and oxygen. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 84, as measured at sidewalls of the semiconductor material portions (3S, 3D, 3B, 4S, 4D, 4B) or at sidewalls of the semiconductor material stacks (5S, 5D, 5B, 5C, 6S, 6D, 6B, 6C), can be in a range from 0.9 nm to 10 nm, although lesser and greater thicknesses can also be employed. The high-k dielectric layer 84 can be formed, for example, by thermal oxidation, thermal nitridation, plasma oxidation, plasma nitridation, chemical vapor deposition (CVD), atomic layer deposition (ALD), liquid phase deposition (LPD), or other deposition methods known in the art.

Referring to FIGS. 8A and 8B, a dielectric oxide material layer 83 can be formed as a contiguous layer on the surfaces of the high-k dielectric layer 84. The dielectric oxide material layer 83 includes a dielectric oxide of an alkaline earth element, a dielectric oxide of a Group IIIB element, a dielectric oxide of a Lanthanide element, a dielectric oxide of an alloy of at least two alkaline earth elements, a dielectric oxide of an alloy of at least two Group IIIB elements, a dielectric oxide of an alloy of at least two Lanthanide elements, or an alloy thereof. For example, the dielectric oxide material layer 83 can include scandium oxide, yttrium oxide, magnesium oxide, strontium oxide, barium oxide, lanthanum oxide, lutetium oxide, dysprosium oxide, or an alloy thereof. The dielectric oxide material layer 83 can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The thickness of the dielectric oxide material layer 83 can be in a range from 0.3 nm to 1.5 nm, although lesser and greater thicknesses can also be employed. The dielectric oxide material layer 83, as initially formed, covers the entire area of the high-k dielectric layer 84.

In one embodiment, the dielectric oxide material layer 83 can consist of an oxide of at least one elemental metal that is not present within the high-k dielectric layer 84. For example, the high-k dielectric layer 84 can consist essentially of $HfO_2$, $ZrO_2$, $Al_2O_3$, $TiO_2$, $HfO_xN_y$, $ZrO_xN_y$, $Al_2O_xN_y$, $TiO_xN_y$, a silicate thereof, or an alloy thereof, and the dielectric oxide material layer 83 can consist of an at least one elemental metal selected from alkaline earth elements, Sc, Y, and Lanthanide elements.

A first photoresist layer 47 is applied over the dielectric oxide material layer 83, and is lithographically patterned to cover the dielectric oxide material layer 83 in the first device region 100 and in the third device region 300, while the portions of the dielectric metal oxide material layer 83 in the second device region 200 and the fourth device region 400 are physically exposed to the ambient, i.e., not covered by a remaining portion of the first photoresist layer 47. An isotropic etch can be performed to etch the dielectric oxide material of the dielectric oxide material layer 83 in the second and fourth device regions (200, 400). Portions of the dielectric oxide material layer 83 are removed from above the second semiconductor material portion (4S, 4D, 4B) and the from above the fourth semiconductor material portion (6S, 6D, 6B, 6C).

A stack including a layer of a semiconductor oxide material (i.e., the semiconductor oxide layer 82), the contiguous high-k dielectric layer 84, and the dielectric oxide material layer 83 is formed on various semiconductor material portions (3S, 3D, 3B, 4S, 4D, 4B) and the semiconductor material stacks (5S, 5D, 5B, 5C, 6S, 6D, 6B, 6C). The top surfaces and outer sidewall surfaces of the high-k dielectric layer 84 are physically exposed to the ambient in the second and fourth device regions (200, 400). The first photoresist layer 47 is subsequently removed selective to the dielectric oxide material layer 83 and the high-k dielectric layer 84, for example, by ashing.

Referring to FIGS. 9A and 9B, first sacrificial capping layers (87, 89) can be formed on the top surface of the dielectric oxide material layer 83 and the high-k dielectric layer 84. As used herein, a "sacrificial" element is a disposable element that is subsequently removed. The first sacrificial capping layers (87, 89) include at least one material that prevents loss of the material in the dielectric oxide material layer 83 to an anneal ambient during a subsequent anneal process to be performed on the exemplary semiconductor structure. In one embodiment, the first sacrificial capping layers (87, 89) can include a first sacrificial metallic material layer 87 and a first sacrificial semiconductor layer 89. In an illustrative example, the first sacrificial metallic material layer 87 can include a metallic nitride such as titanium nitride, and the first sacrificial semiconductor layer 89 includes a semiconductor material such as amorphous silicon or polysilicon. The thickness of the first sacrificial metallic material layer 87 can be in a range from 3 nm to 20 nm, and the thickness of the first sacrificial semiconductor layer 89 can be in a range from 3 nm to 20 nm, although lesser and greater thicknesses can be employed for each of the first sacrificial metallic material layer 87 and the first sacrificial semiconductor layer 89. While the present disclosure is described employing an embodiment in which a plurality of layers is present within the first sacrificial capping layers (87, 89), embodiments are contemplated herein in which a single sacrificial capping layer is employed in lieu of the plurality of sacrificial capping layers.

Referring to FIGS. 10A and 10B, the exemplary semiconductor structure is annealed at an elevated temperature to induce diffusion of the material of the dielectric oxide material layer 83 through the high-k dielectric layer 84 and into the semiconductor oxide layer 82 within the first and third device regions (100, 300). The presence of the first sacrificial capping layers (87, 89) prevents loss of the dielectric oxide material in the dielectric oxide material layer 83 to an anneal ambient during the anneal process by blocking diffusion of the dielectric oxide material through the first sacrificial capping layers (87, 89). Further, the semiconductor oxide layer 82 provides a gettering effect for the dielectric oxide material that diffuses through the high-k dielectric layer 84. Incorporation of the dielectric oxide material into the portions of the layer of the semiconductor oxide material (i.e., the semiconductor oxide layer 83) leads to modification of the composition of the portion of the layer of the semiconductor oxide material within the first and third device regions (100, 300). Specifically, the dielectric oxide material originating from the dielectric oxide material layer 83 prior to the anneal becomes incorporated during the anneal into the underlying portion of the layer of the semiconductor oxide material within the first and third device regions (100, 300) to form an adjustment oxide layer 81. If the semiconductor oxide layer 82 includes an oxide of a semiconductor material containing silicon (such as silicon, a silicon-germanium alloy, and a silicon-carbon alloy), the adjustment oxide layer 81 includes a silicate of the at least one non-oxygen element contained in the dielectric oxide material layer 83.

The elevated temperature and duration of the anneal process can be selected to provide sufficient diffusion for the material of the dielectric oxide material layer 83, and to optimize formation of the adjustment oxide layer 81. In one embodiment, the elevated temperature of the anneal process can be in a range from 700° C. to 1,100° C. In another embodiment, the elevated temperature of the anneal process can be in a range from 800° C. to 1,000° C. The duration of the anneal process can be in a range from 10 seconds to 2 hours. In general, a shorter duration of the anneal process corresponds to a higher anneal temperature.

The anneal process forms a first dielectric material stack (81, 84) over the first semiconductor material portion (3S, 3D, 3B) and the third semiconductor material portion (5S, 5D, 5B, 5C), and forms a second dielectric material stack (82, 84) over the second semiconductor material portion (4S, 4D, 4B) and the second semiconductor material stack (6S, 6D, 6B, 6C). In one embodiment, the first dielectric material stack (81, 84) can include an adjustment oxide layer 81 containing a silicate of a metal selected from alkaline earth metals, Group IIIB elements, and rare earth metals, and a first portion of a contiguous high dielectric constant (high-k) dielectric layer (i.e., the high-k dielectric layer 82), and the second dielectric material stack (82,84) including a semiconductor oxide layer 82 and a second portion of the contiguous high-k dielectric layer.

In one embodiment, the dielectric oxide material layer 83 as formed at a processing step of FIGS. 8A and 8B can consist of an oxide of at least one metal that is not present in the high-k dielectric layer 84, and the semiconductor oxide layer 82 in the second and fourth device regions (200, 400) does not include any of the at least one metal present in the dielectric oxide material layer 83. The adjustment oxide layer 81 in the first and third device regions (100, 300) can include a silicate of the at least one metal in the dielectric oxide material layer 83, and the semiconductor oxide layer 82 in the second and fourth device regions (200, 400) does not include any of the at least one metal present within the silicate of the adjustment oxide layer 81. The first portion of the high-k dielectric layer 84 within the first and third device regions (100, 300) can include the at least one metal present within the silicate of the adjustment oxide layer 81 at a lesser atomic concentration than in the adjustment oxide layer 81. In one embodiment, the atomic concentration of the at least one metal (that is present within the silicate of the adjustment oxide layer 81) within the first portion of the high-k dielectric layer 84 over the first and third device regions (100, 300) can be less than one half of the atomic concentration of the at least one metal within the adjustment oxide layer 81. In another embodiment, the atomic concentration of the at least one metal within the first portion of the high-k dielectric layer 84 over the first and third device regions (100, 300) can be less than 20% of the atomic concentration of the at least one metal within the adjustment oxide layer 81.

Referring to FIGS. 11A and 11B, the first sacrificial capping layers (87, 89) can be removed by at least one etch process. Each of the at least one etch process can be an isotropic etch process. Removal of the first sacrificial capping layers (87, 89) can be performed selective to the high-k dielectric layer 84, i.e., without etching the high-k dielectric layer 84 in any significant amount.

Referring to FIGS. 12A and 12B, a first metallic material layer 92 and a second sacrificial capping layer 93 are formed on the surfaces of the high-k dielectric layer 84 and over the first and second dielectric material stacks (81, 82, 84). In one embodiment, the first metallic material layer 92 can be a first work function material layer that controls the work functions of the semiconductor devices to be formed employing the first semiconductor material portion (3S, 3D, 3B) and the first semiconductor material stack (5S, 5D, 5B, 5C). In one embodiment, the first metallic material layer 92 can include a conductive metallic nitride such as TiN, TaN, WN, or an alloy thereof. In one embodiment, the first metallic material layer 92 can be composited of TiN, which can function as a balance band edge work function material if not annealed at an elevated temperature and can function as a conduction band edge work function when annealed at an elevated temperature.

The first metallic material layer 92 can be deposited, for example, by chemical vapor deposition (CVD), atomic layer deposition (ALD), or physical vapor deposition (PVD). The first metallic material layer 92 can be deposited as a conformal layer, and the thickness of the first metallic material layer 92 can be in a range from 2 nm to 20 nm, although lesser and greater thicknesses can also be employed.

The second sacrificial capping layer 93 can include a semiconductor material such as amorphous silicon, an amorphous silicon-germanium alloy, polysilicon, or a silicon-containing polycrystalline alloy. The thickness of the second sacrificial capping layer 93 can be in a range from 5 m to 50 nm, although lesser and greater thicknesses can also be employed.

Referring to FIGS. 13A and 13B, an anneal process is performed on the exemplary semiconductor structure to form oxygen deficiency in the high-k dielectric layer 84. During the anneal process, any oxygen supply from the anneal ambient into the high-k dielectric layer 84 is blocked by the second sacrificial capping layer 93. Due to loss of oxygen atoms to the adjustment oxide layer 81 and the semiconductor oxide layer 82 during the anneal process, oxygen vacancies are formed in the high-k gate dielectric layer 84 during the anneal. The high-k dielectric layer 82 in a state that includes oxygen vacancies after the anneal process is herein referred to as an oxygen-deficient high-k dielectric layer 94, which is a state of the contiguous high-k dielectric material layer 84 in which the dielectric oxide of at least one metallic element has become non-stoichiometric, and specifically, oxygen deficient. The concentration of the oxygen deficiency can be in a range from $1.0 \times 10^{13}/cm^3$ to $1.0 \times 10^{15}/cm^3$, although lesser and greater concentrations of oxygen deficiency can also be employed.

The anneal can be performed at a temperature greater than 400° C. The anneal can change the effective work function of the first metallic material layer 92. For example, if the first metallic material layer 92 includes a conductive metallic nitride such as TiN, the anneal can change the effective work function of the first metallic material layer to provide a conduction band edge work function, i.e., a work function that is closer to the conduction band edges of the first and second semiconductor materials in the semiconductor material portions (3S, 3D, 3B, 4S, 4D, 4B) and the semiconductor material stacks (5S, 5D, 5B, 5C, 6S, 6D, 6B, 6C).

Referring to FIGS. 14A and 14B, the second sacrificial capping layer 93 can be removed selective to the first metallic material layer 92. An isotropic etch or an anisotropic etch can be employed to remove the second sacrificial capping layer 93.

A second photoresist layer 57 is applied over the first metallic material layer 92, and is lithographically patterned to cover the first device region 100 and the third device region 300, while the portions of the first metallic material layer 92 in the second device region 200 and the fourth device region 400 are not covered by the second photoresist layer 57. The physically exposed portions of the first metallic material layer 92 is removed from the second device region 200 and the fourth device region by an etch, which can be an isotropic etch or an anisotropic etch. The etch that removes the physically exposed portions of the first metallic material layer 92 can be selective to the dielectric material of the oxygen-deficient high-k dielectric layer 94.

The first metallic material layer 92 is thus patterned such that remaining portions of the first metallic material layer 92 are present in the first and third device regions (100, 300), and are not present in the second and fourth device regions (200, 400). A top surface of a second portion of the oxygen-deficient high-k dielectric layer 94 becomes physically exposed by removal of a portion of the first metallic material layer 92 from the second and fourth device regions (200, 400), while a remaining portion of the first metallic material layer 92 is present over the first semiconductor material portion (3S, 3D, 3B) and the first semiconductor material stack (4S, 4D, 4B, 4C).

In one embodiment, the oxygen deficiency in the second portion of the oxygen-deficient high-k dielectric layer 94 can be cured by exposing the top surface of the second portion of the high-k dielectric layer 94. In this case, the portions of the oxygen-deficient high-k dielectric layer 94 within the second and fourth device regions (200, 400) are exposed to the ambient of the etch, and/or can be subsequently exposed to another ambient such as air. The portions of the oxygen-deficient high-k dielectric layer 94 in the second and fourth device regions (200, 400) are exposed to an oxygen-containing ambient during, or after, the etch process that removes the physically exposed portions of the first metallic material layer 92. Oxygen atoms from the oxygen-containing ambient diffuse into the physically exposed portions of the oxygen-deficient high-k dielectric layer 94 within the second and fourth device regions (200, 400) to remove the oxygen vacancies therein. Thus, the portions of the oxygen-deficient high-k dielectric layer 94 within the second and fourth device regions (200, 400) can lose oxygen vacancies. The resulting high-k dielectric material within the second and fourth device regions (200, 400) in which oxygen deficiency has been cured is herein referred to as a high-k dielectric layer 84, which has the same composition as the high-k dielectric layer 84 as formed at the processing steps of FIGS. 7A and 7B. The second photoresist layer 57 can be removed selective to the first metallic material layer 92 and the high-k dielectric layer 84, for example, by ashing.

Referring to FIGS. 15A and 15B, a second metallic material layer 96 can be formed on the surfaces of the high-k dielectric layer 84 and the first metallic material layer 92. In one embodiment, the second metallic material layer 96 can be a second work function material layer that controls the work functions of the semiconductor devices to be formed employing the second semiconductor material portion (4S, 4D, 4B) and the second semiconductor material stack (6S, 6D, 6B, 6C). In one embodiment, the second metallic material layer 96 can include a conductive metallic nitride such as TiN, TaN, WN, or an alloy thereof. In one embodiment, the second metallic material layer 96 can be composited of TiN, which can function as a balance band edge work function material provided that the material is not subsequently subjected to an anneal at a temperature greater than 400° C.

The second metallic material layer 96 can be deposited, for example, by chemical vapor deposition (CVD), atomic layer deposition (ALD), or physical vapor deposition (PVD). The second metallic material layer 96 can be deposited as a conformal layer, and the thickness of the second metallic material layer 96 can be in a range from 2 nm to 20 nm, although lesser and greater thicknesses can also be employed.

Referring to FIGS. 16A and 16B, at least one conductive material directly on the second metallic material layer. The at least one conductive material can include a doped semiconductor material and/or a metallic material. For example, the at least one conductive material can include Al, W, Cu, Ag, Au, alloys thereof, or combinations thereof. The at least one conductive material can be deposited, for example, by physical vapor deposition (PVD), chemical vapor deposition (CVD), and/or electroplating.

Portions of the at least one conductive material, the first and second metallic material layers (92, 96), the oxygen-deficient high-k dielectric layer 94 (which is a high-k dielectric layer including oxygen vacancies), the high-k dielectric layer 84, the adjustment oxide layer 81, and the semiconductor oxide layer 82 located above the horizontal plane including the top surface of the planarization dielectric layer 60 can be removed by a planarization process. The planarization process can be a chemical mechanical planarization (CMP) process. Each remaining portions of the at least one conductive material constitutes a gate electrode portion 98.

The exemplary semiconductor structure includes a first field effect transistor located within the first device region 100, a second field effect transistor located within the second device region 200, a third field effect transistor located within the third device region 300, and a fourth field effect transistor located within the fourth device region 400.

The first field effect transistor includes a first gate dielectric, which includes portions of the adjustment oxide layer 81 and the oxygen-deficient high-k dielectric layer 94 in the first device region 100. The first gate dielectric (81, 94) straddles the first semiconductor material portion (3S, 3D, 3B), and can contain a stack of an adjustment oxide layer 81 including a silicate of a metal selected from alkaline earth metals, Group IIIB elements, and rare earth metals, and can further contain a first high dielectric constant (high-k) gate dielectric including a dielectric metal oxide and having a dielectric constant greater than 8.0. The first field effect transistor further includes a first gate electrode (92, 96, 98) in contact with the first gate dielectric (81, 94) and containing a first metallic material layer 92 that is in contact with the first high-k gate dielectric, which is a portion of the oxygen-deficient high-k dielectric layer 94 in the first device region 100.

The second field effect transistor includes a second gate dielectric (82, 84), which includes portions of the semiconductor oxide layer 82 and the high-k dielectric layer 84 within the second device region 200. The second gate dielectric (82, 84) straddles a second semiconductor material portion (4S, 4D, 4B) and containing a stack of a semiconductor oxide layer 82 and a second high-k gate dielectric, which is a portion of the high-k dielectric layer 84 within the second device region 200. The first high-k gate dielectric 94 can differ in composition from the second high-k gate dielectric 84 by presence of oxygen deficiency in the first high-k gate dielectric 94. The second field effect transistor further includes a second gate electrode (96, 98) in contact with the second gate dielectric 84 and containing a second metallic material layer 96 that is in contact with the second high-k gate dielectric 84.

In one embodiment, the second high-k gate dielectric 96 does not include the metal in the silicate contained within the adjustment oxide layer 81. In one embodiment, the first high-k gate dielectric 84 can include the metal within the silicate of the adjustment oxide layer 81 at a lesser concentration than the adjustment oxide layer 81. In one embodiment, the first metallic material layer 92 and the second metallic material layer 96 can differ from each other in at least one of thickness and composition.

The third field effect transistor includes a third gate dielectric, which includes portions of the adjustment oxide layer 81 and the oxygen-deficient high-k dielectric layer 94 in the third device region 300. The third gate dielectric (81, 94) straddles the first semiconductor material stack (5S, 5D, 5B, 5C), and contains a stack of another adjustment oxide layer (which is a portion of the adjustment oxide layer 81 within the third device region 300) and a third high-k gate dielectric (i.e., the portion of the oxygen-deficient high-k dielectric layer 94 within the third device region 300) that includes the same dielectric metal oxide as the first high-k gate dielectric. The first semiconductor material stack (5S, 5D, 5B, 5C) includes a first semiconductor shell structure 54 (See FIG. 2B) embedding, and in epitaxial alignment with, a third semiconductor material portion 52 (See FIG. 2B). The third field effect transistor further includes a third gate electrode, which includes the portions of the first and second metallic material layers (92, 96) and the gate electrode portion 98 within the third device region 300. The third gate electrode (92, 96, 98) is in contact with the third gate dielectric (81, 94) and contains a layer of a metallic material, which is a portion of the first metallic layer 92 and has the same composition and thickness as the first metallic material layer 92 within the first device region 100. The layer of the metallic material in the third gate electrode (92, 96, 98) is in contact with the third high-k gate dielectric (81, 94).

The fourth field effect transistor includes a fourth gate dielectric, which includes portions of the semiconductor oxide layer 82 and the high-k dielectric layer 84 within the fourth device region 400. The fourth gate dielectric (82, 84) straddles a second semiconductor material stack (6S, 6D, 6B, 6C), and contains a stack of another semiconductor oxide layer (which is a portion of the semiconductor oxide layer 82 in the fourth device region 400) and a fourth high-k gate dielectric (i.e., the portion of the high-k dielectric layer 84 within the fourth device region 400) having the same composition and thickness as the second high-k gate dielectric (82, 84) in the second device region 200. The second semiconductor material stack (6S, 6D, 6B, 6C) includes a second semiconductor shell structure 64 embedding, and in epitaxial alignment with, a fourth semiconductor material portion 62.

The first high-k gate dielectric 94 of the first field effect transistor and the second high-k gate dielectric 84 of the second field effect transistor can include dielectric metal oxides of a same metal, and differ in composition by presence of a doping by at least one elemental metal that is present within the adjustment oxide layer 81 within the first high-k gate dielectric 94 and by absence of the at least one elemental metal that is present within the adjustment oxide layer 81 within the second high-k gate dielectric 84.

The first gate electrode (92, 96, 98) can include a metallic material layer, i.e., a portion of the second metallic material layer 96, which has the same composition and thickness as the portion of the second metallic material layer 96 in the second device region 200. The second metallic layer 96 within the first gate electrode (92, 96, 98) is in contact with the first metallic material layer 92. Each of the first and second gate electrodes includes a conductive material in contact with a portion of the second metallic material layer 96.

The multiple field effect transistors of the present disclosure can provide multiple threshold voltages by the various combinations of the first metallic layer 92 and the second metallic layer 96 as the work function material layer, i.e., a material layer that determines the work function of a field effect transistor. Further, the combination of a semiconductor material portion and a semiconductor material stack having two different semiconductor materials at the channel regions underlying the gate electrodes provides additional changes in the threshold voltage for turning on the respective field effect transistors. The combination of an adjustment oxide layer 81 and an oxygen-deficient high-k dielectric layer provides an additional shift in the work function levels of the first and third field effect transistors with respect the second and fourth field effect transistors. The above properties can be combined to provide n-type field effect transistors having different threshold voltages in the first and third field effect transistors, while providing p-type field effect transistors having different threshold voltages in the second and fourth field effect transistors.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a semiconductor structure comprising:
    forming at least a first semiconductor material portion and a second semiconductor material portion on a substrate;
    forming a first dielectric material stack over said first semiconductor material portion and a second dielectric material stack over said second semiconductor material portion, said first dielectric material stack comprising an adjustment oxide layer including a silicate of a metal selected from alkaline earth metals, Group IIIB elements, and rare earth metals and a first portion of a contiguous high dielectric constant (high-k) dielectric layer, and said second dielectric material stack comprising a semiconductor oxide layer and a second portion of said contiguous high-k dielectric layer;
    forming a first metallic material layer and a sacrificial capping layer on said high-k dielectric layer over said first and second dielectric material stacks;
    inducing oxygen deficiency in said contiguous high-k dielectric layer employing an anneal in which oxygen supply into said contiguous high-k dielectric layer is blocked by said sacrificial capping layer;
    physically exposing a top surface of said second portion of said contiguous high-k dielectric layer by removing a portion of said first metallic material layer, while a remaining portion of said first metallic material layer is present over said first semiconductor material portion; and
    forming a second metallic material layer directly on said top surface of said second portion of said contiguous high-k dielectric layer and a top surface of said first metallic material layer.

2. The method of claim 1, further comprising curing oxygen deficiency in said second portion of said contiguous high-k dielectric layer by exposing said top surface of said second portion of said contiguous high-k dielectric layer prior to formation of said second metallic material layer.

3. The method of claim 1, further comprising:
    forming a stack including a layer of a semiconductor oxide material, said contiguous high-k dielectric layer, and a dielectric oxide material layer on said first and second semiconductor material portions, said layer of said semiconductor oxide material including said semiconductor oxide layer; and
    annealing said stack employing at least another sacrificial capping layer, wherein a material of said dielectric oxide material layer diffuses through said high-k dielectric layer into an underlying portion of said layer of said semiconductor oxide material to form said adjustment oxide layer.

4. The method of claim 3, further comprising removing a portion of said dielectric oxide material layer from above said second semiconductor material portion prior to formation of said at least another sacrificial capping layer.

5. The method of claim 1, further comprising depositing at least one conductive material directly on said second metallic material layer.

6. The method of claim 5, further comprising:
    forming a planarization dielectric layer over said first semiconductor material portion and said second semiconductor material portion prior to formation of said first and second dielectric material stacks; and
    removing portions of said at least one conductive material and said first and second metallic material layers from above a horizontal plane including a top surface of said planarization dielectric layer.

7. The method of claim 1, further comprising:
    forming a third semiconductor material portion comprising a same material as said first and second semiconductor material portions on said substrate;
    forming a semiconductor shell structure on said third semiconductor material portion by selective epitaxial deposition of a semiconductor material having a different composition than said third semiconductor material portion; and
    forming a third dielectric material stack having a same composition as said first dielectric material stack over said third semiconductor material portion.

8. The method of claim 7, wherein said first metallic material layer is deposited on said third dielectric material stack, and another remaining portion of said first metallic material layer is present over said third dielectric material stack after removal of said portion of said first metallic material layer.

9. The method of claim 8, further comprising:
    forming a fourth semiconductor material portion comprising said same material on said substrate;
    forming another semiconductor shell structure on said third semiconductor material portion by said selective epitaxial deposition; and
    forming a fourth dielectric material stack having a same composition as said second dielectric material stack over said fourth semiconductor material portion.

10. The method of claim 9, wherein said first metallic material layer is deposited on said fourth dielectric material stack, and is removed from above said fourth semiconductor material portion at a time of removal of said portion of said first metallic material layer.

* * * * *